United States Patent
Genei et al.

(10) Patent No.: US 9,472,713 B2
(45) Date of Patent: Oct. 18, 2016

(54) SEMICONDUCTOR LIGHT-EMITTING DEVICE

(71) Applicant: KABUSHIKI KAISHA TOSHIBA, Minato-ku (JP)

(72) Inventors: Koichi Genei, Chiba-ken (JP); Tokuhiko Matsunaga, Fukuoka-ken (JP); Katsufumi Kondo, Fukuoka-ken (JP); Shinji Nunotani, Fukuoka-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 112 days.

(21) Appl. No.: 14/082,864

(22) Filed: Nov. 18, 2013

(65) Prior Publication Data

US 2014/0077221 A1    Mar. 20, 2014

Related U.S. Application Data

(63) Continuation of application No. PCT/JP2012/001919, filed on Mar. 21, 2012.

(30) Foreign Application Priority Data

May 18, 2011 (JP) ................................. 2011-111808
Jul. 27, 2011 (JP) ................................. 2011-164785

(51) Int. Cl.
  *H01L 33/12*    (2010.01)
  *H01L 33/38*    (2010.01)
  (Continued)

(52) U.S. Cl.
  CPC ........... *H01L 33/0025* (2013.01); *H01L 33/14* (2013.01); *H01L 33/38* (2013.01); *H01L 33/405* (2013.01); *H01L 33/30* (2013.01); *H01L 33/387* (2013.01)

(58) Field of Classification Search
  CPC ... H01L 33/12; H01L 33/145; H01L 33/387; H01L 33/0025; H01L 33/002; H01L 33/0075; H01L 33/10; H01L 33/14
  See application file for complete search history.

(56) References Cited

U.S. PATENT DOCUMENTS

2002/0104996 A1* 8/2002 Kuo et al. ...................... 257/79
2007/0096116 A1  5/2007 Yasuda et al.
(Continued)

FOREIGN PATENT DOCUMENTS

JP     3-139890    6/1991
JP     07-094780   4/1995
(Continued)

OTHER PUBLICATIONS

Office Action issued on Oct. 30, 2014 in the corresponding Japanese Patent Application No. 2013-221315 (with English Translation).

*Primary Examiner* — Matthew Landau
*Assistant Examiner* — Scott Stowe
(74) *Attorney, Agent, or Firm* — Oblon, McClelland, Maier & Neustadt, L.L.P.

(57) ABSTRACT

An embodiment has an emission layer, a first electrode having a reflective metal layer, an insulating layer, first and second conductivity type layers, and a second electrode. The insulating layer is provided on the first electrode and has an opening where a portion of the first electrode is provided. The first conductivity type layer is provided between the insulating layer and the emission layer and has bandgap energy larger than that of the emission layer. The second conductivity type layer is provided on the emission layer and has a current diffusion layer and a second contact layer. The second contact layer is not superimposed on the opening of the insulating layer, and a thickness of the current diffusion layer is larger than that of the first contact layer. The second electrode has a pad portion and a thin portion extends from the pad portion onto the second contact layer.

20 Claims, 15 Drawing Sheets

(51) Int. Cl.
*H01L 33/00* (2010.01)
*H01L 33/14* (2010.01)
*H01L 33/40* (2010.01)
*H01L 33/30* (2010.01)

(56) References Cited

U.S. PATENT DOCUMENTS

| | | |
|---|---|---|
| 2008/0173863 A1 | 7/2008 | Hahn et al. |
| 2009/0014734 A1 | 1/2009 | Nishikawa et al. |
| 2011/0198660 A1* | 8/2011 | Bae ................ H01L 33/385 257/99 |
| 2011/0291133 A1* | 12/2011 | Tanaka et al. ............. 257/98 |
| 2014/0077221 A1 | 3/2014 | Genei et al. |

FOREIGN PATENT DOCUMENTS

| | | |
|---|---|---|
| JP | 2005-108880 | 4/2005 |
| JP | 2007-123573 | 5/2007 |
| JP | 2007-288195 | 11/2007 |
| JP | 2008-153344 | 7/2008 |
| JP | 2008-166661 | 7/2008 |
| JP | 2008-210886 | 9/2008 |
| JP | 2011-029213 | 2/2011 |
| JP | 2012-256811 A | 12/2012 |

* cited by examiner

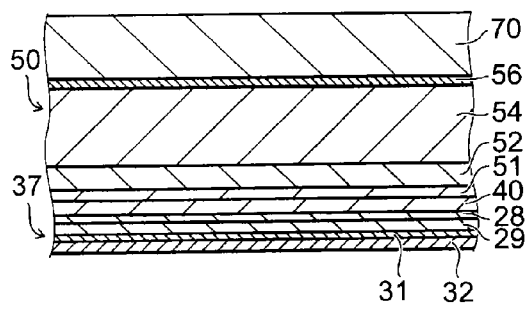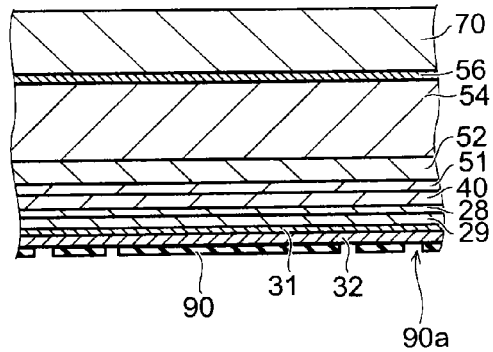
FIG. 2A  FIG. 2B
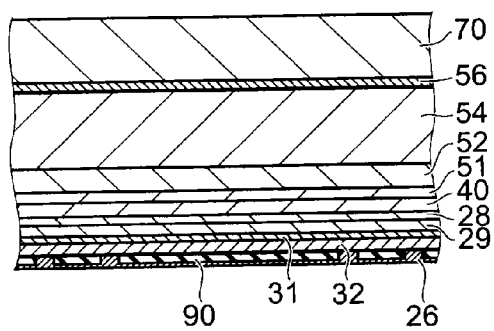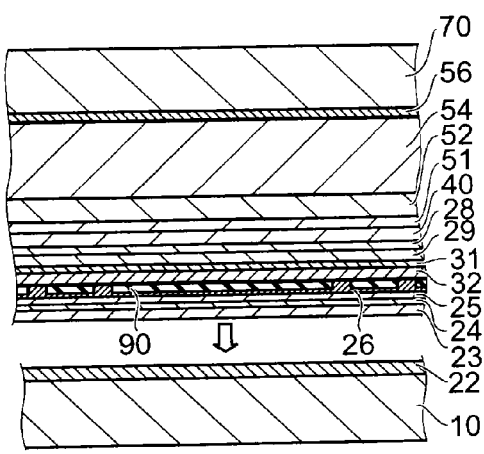
FIG. 2C  FIG. 2D
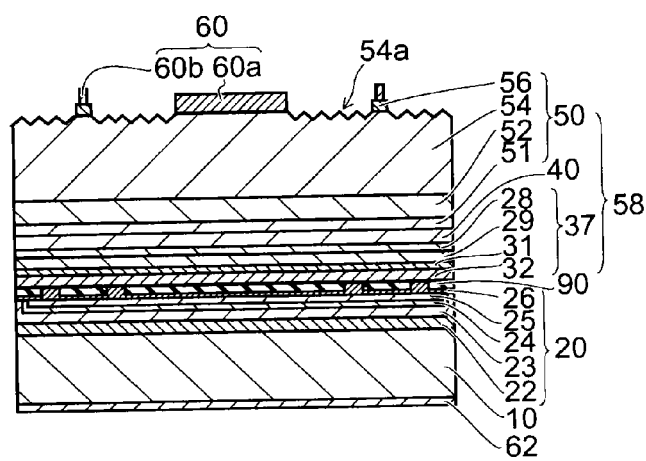
FIG. 2E

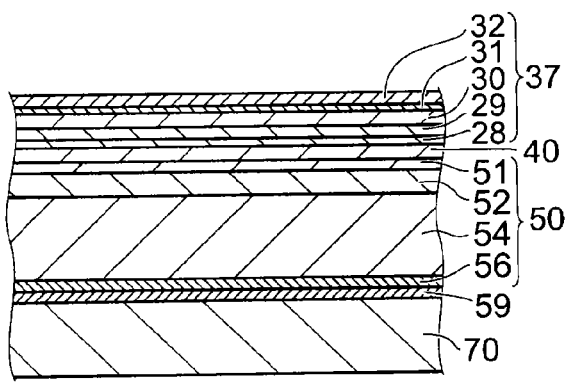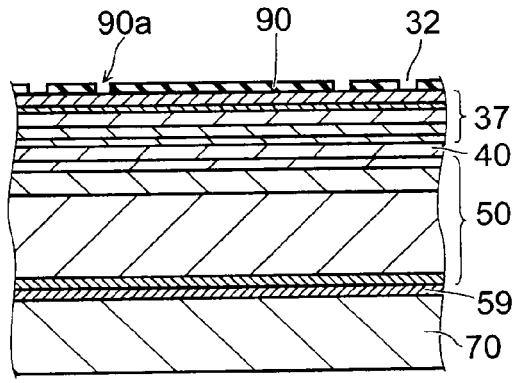
FIG. 13A  FIG. 13B
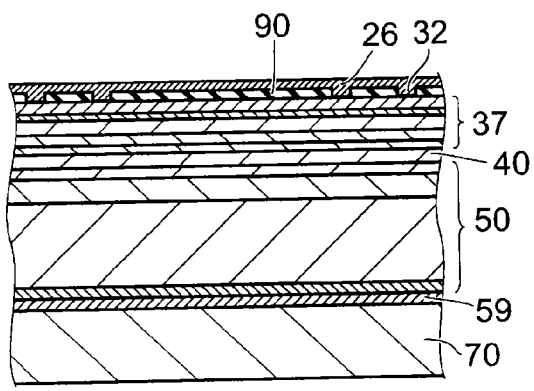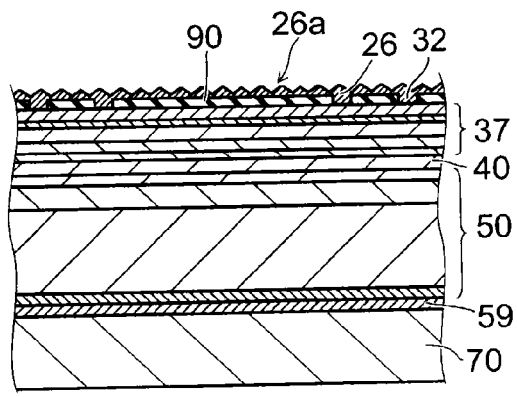
FIG. 13C  FIG. 13D
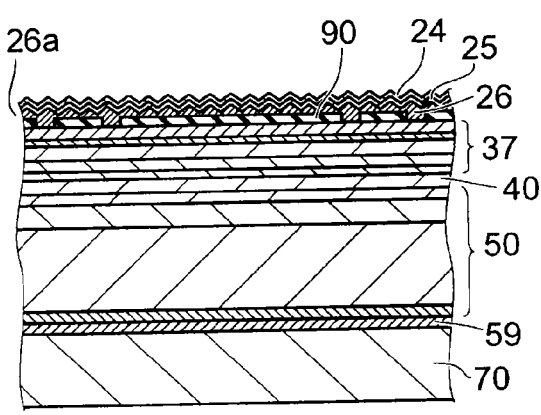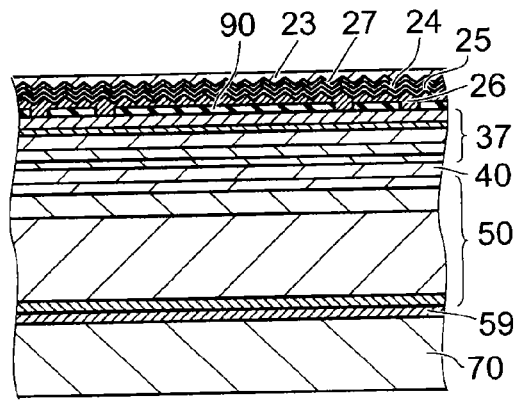
FIG. 13E  FIG. 13F

SEMICONDUCTOR LIGHT-EMITTING DEVICE

CROSS-REFERENCE TO RELATED APPLICATION

This application is based upon and claims the benefit of priority from the prior Japanese Patent Application No. 2011-111808, filed on May 18, 2011 and Japanese Patent Application No. 2011-164785, filed on Jul. 27, 2011, the entire contents of which are incorporated herein by reference. This application is a continuation application of International Application No. PCT/JP2012/001919, filed on Mar. 21, 2013.

FIELD

Embodiments described herein relate generally to a semiconductor light-emitting device.

BACKGROUND

A semiconductor light-emitting device such as a light-emitting diode (LED) which is used in a lighting device, a display device, a traffic light etc. requires output of a higher level.

A light extraction efficiency of a semiconductor light-emitting device can be increased by providing a reflective metal layer on a rear side of an emission layer of the semiconductor light-emitting device such that light emitted from the emission layer toward a backside is reflected toward a front side.

However, when a distance between the emission layer and the reflective metal layer is increased, the light reflected by the reflective metal layer is laterally spread, which causes a problem of reducing a light quantity of a light flux extracted from the front side.

BRIEF DESCRIPTION OF THE DRAWINGS

FIG. 2A is a cross-sectional view illustrating a step of an example of a method of manufacturing the semiconductor light-emitting device according to the first embodiment.

FIG. 2B is a cross-sectional view illustrating a step of the example of a method of manufacturing the semiconductor light-emitting device according to the first embodiment.

FIG. 2C is a cross-sectional view illustrating a step of the example of a method of manufacturing the semiconductor light-emitting device according to the first embodiment.

FIG. 2D is a cross-sectional view illustrating a step of the example of a method of manufacturing the semiconductor light-emitting device according to the first embodiment.

FIG. 2E is a cross-sectional view illustrating a step of the example of a method of manufacturing the semiconductor light-emitting device according to the first embodiment.

FIG. 13A is a cross-sectional view illustrating a step of an example of a method of manufacturing the semiconductor light-emitting device according to the third embodiment.

FIG. 13B is a cross-sectional view illustrating a step of an example of a method of manufacturing the semiconductor light-emitting device according to the third embodiment.

FIG. 13C is a cross-sectional view illustrating a step of an example of a method of manufacturing the semiconductor light-emitting device according to the third embodiment.

FIG. 13D is a cross-sectional view illustrating a step of an example of a method of manufacturing the semiconductor light-emitting device according to the third embodiment.

FIG. 13E is a cross-sectional view illustrating a step of an example of a method of manufacturing the semiconductor light-emitting device according to the third embodiment.

FIG. 13F is a cross-sectional view illustrating a step of an example of a method of manufacturing the semiconductor light-emitting device according to the third embodiment.

DETAILED DESCRIPTION

Figure 1A:
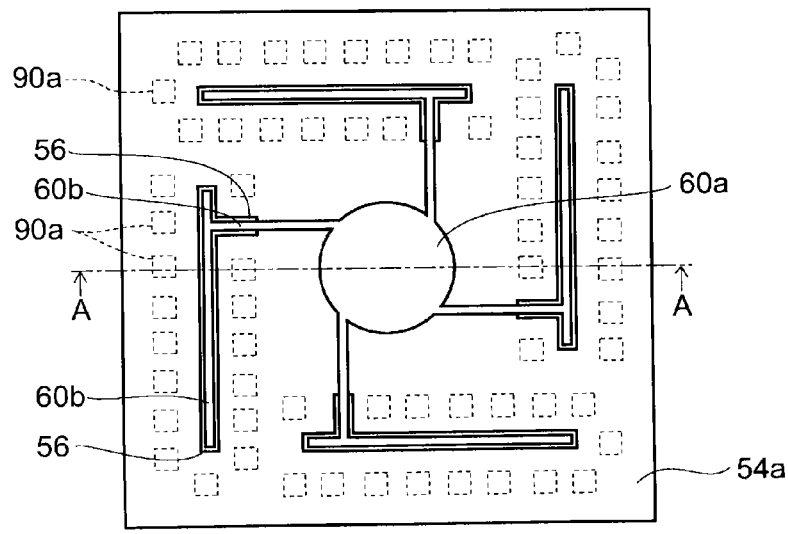
FIG. 1A is a schematic top view of a semiconductor light-emitting device according to a first embodiment.

A semiconductor light-emitting device according to an embodiment has an emission layer, a first electrode having a reflective metal layer, an insulating layer, a first conductivity type layer, a second conductivity type layer and a second electrode. The emission layer is formed of a group III-V compound semiconductor. The insulating layer is provided on the first electrode and has an opening in which a portion of the first electrode is provided. The first conductivity type layer is provided between the insulating layer and the portion of the first electrode and the emission layer, and is formed of a group III-V compound semiconductor having bandgap energy larger than that of the emission layer. The first conductivity type layer includes at least a first contact layer, a composition gradient layer and a first cladding layer. The second conductivity type layer is provided on the emission layer and has at least a current diffusion layer and a second contact layer sequentially formed from a side of the emission layer. The second contact layer is not superimposed on the opening of the insulating layer. A thickness of the current diffusion layer is larger than that of the first contact layer. The second electrode has a pad portion provided on a region of a surface of the current diffusion layer on which the second contact layer is not formed. A thin stripe portion extends from the pad portion onto the second contact layer.

Hereinafter, further embodiments will be described with reference to the drawings.

In the drawings, the same reference numerals denote the same or similar portions respectively.

Figures 1B, 1C:
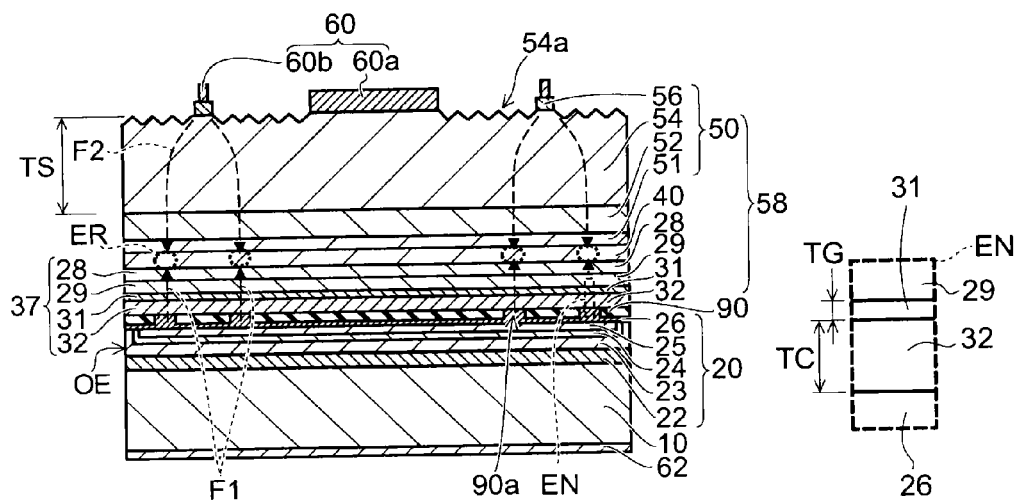
FIG. 1B is a schematic cross-sectional view taken along line A-A of FIG. 1A.
FIG. 1C is a schematic enlarged cross-sectional view of a region EN of FIG. 1B.

FIG. 1A is a schematic top view of a semiconductor light-emitting device according to a first embodiment. FIG. 1B is a schematic cross-sectional view taken along line A-A of FIG. 1A. FIG. 1C is a schematic enlarged cross-sectional view of a region EN of FIG. 1B.

As illustrated in FIG. 1B, the semiconductor light-emitting device according to the first embodiment has a support substrate 10, a first electrode 20 provided on the support substrate 10, and a first conductivity type layer 37 provided on the first electrode 20.

The semiconductor light-emitting device further has an emission layer 40 provided on the first conductivity type layer 37, a second conductivity type layer 50 provided on the emission layer 40, and a second electrode 60 provided on the second conductivity type layer 50.

The emission layer 40 is formed of a single-layer or a multi-layer of a group III-V compound semiconductor and has a multiple quantum well (MQW) structure. The composition of the emission layer 40 may be $In_x(Ga_{1-y}Al_y)_{1-x}P$ where $0 \le x \le 1$, $0 \le y \le 1$. In this case, the group III element is indium (In), gallium (Ga), and aluminum (Al), and the group V element is phosphorus (P). Such an emission layer can emit light of a wavelength range from a green color to a red color. The composition of the emission layer 40 may also be $Al_zGa_{1-z}As$ (where $0 \le z \le 0.45$). In this case, the group III element is Al and Ga, and the group V element is As. Such an emission layer can emit light of a wavelength range from a red color to near-infrared light.

Further, the composition of the emission layer 40 may also be $In_sGa_{1-s}As_tP_{1-t}$ where $0 \le s \le 1$, $0 \le t \le 1$. In this case, the group III element is In and Ga, and the group V element is As and P. Such an emission layer can emit light of a wavelength range of near-infrared light. In addition, the composition of the emission layer 40 can be expressed as $In_uGa_vAl_{1-u-v}N$ where $0 \le u \le 1$, $0 \le v \le 1$, $u+v \le 1$. In this case, the group III element is In, Ga and Al, and the group V element is nitrogen (N). Such an emission layer can emit light of a wavelength range from an ultraviolet to a green color.

The first conductivity type layer 37 has a first contact layer 32, a composition gradient layer 31, a first cladding layer 29, and a light guide layer 28. Bandgap energy of the first conductivity type layer 37 is larger than that of the emission layer 40. This suppresses the emitted light from being absorbed by the first conductivity type layer 37, and thus, a light output of a high level can be achieved. The first conductivity type layer 37 can be formed of $In_s(Ga_{1-t}Al_t)_{1-s}P$ of a first conductivity type where $0 \le s \le 1$, $0 \le t \le 1$.

The first contact layer 32 is formed of a group III-V compound semiconductor having a lower refractive index than an average refractive index of the emission layer 40 having the MQW structure. The average refractive index of the emission layer 40 having the MQW structure means a refractive index of a bulk semiconductor at a wavelength of emitted light, and is defined as an average value of a refractive index of a well layer and a refractive index of a barrier layer. As shown in FIG. 1C as a cross-section of a region EN of FIG. 1B, the first contact layer 32 is formed of GaP and has a first conductivity type, for example. A portion of the first contact layer 32 contacts a portion of a transparent conductive film 26 of the first electrode 20 through a plurality of rectangular openings 90a provided in an insulating layer 90. The composition gradient layer 31 is formed of a group III-V compound semiconductor. For example, the composition gradient layer 31 may be formed of $In_x(Ga_{1-y}Al_y)_{1-x}P$ of a first conductivity type where $0 < x \le 1$, $0 < y \le 1$. In the composition gradient layer, a composition ratio x of In and a composition ratio y of Al are lowered toward the first contact layer 32. Thus, a composition ratio of Ga increases, and the composition approach GaP.

When viewed downward from the top of FIG. 1B, a plurality of second contact layers 56 is provided not to overlap a contact surface of the first contact layer 32 and the transparent conductive film 26. A current flows between the first electrode 20 and the second electrode 60 through openings 90a of the insulating layer 90 as illustrated in FIGS. 1A and 1B. A shortest distance between thin stripe portions 60b of the second electrode 60 and end portions of the openings 90a of the insulating layer 90 may be 5 μm, for example, when FIG. 1B is viewed from above. As illustrated in FIG. 1A, thin stripe portions 60b are formed on second contact layers 56, respectively. The thin stripe portions 60b contact with second contact layers 56 and with a surface of a portion of a current diffusion layer 54 where concavity and convexity 54a are not formed. The thin stripe portions 60b connect a pad portion 60a and the second contact layers 56, and are provided to extend on the second contact layers 56.

In the first embodiment, carriers injected from the thin stripe portions 60b constituting the second electrode 60 are laterally diffused by the current diffusion layer 54 and flow into the emission layer 40, resulting in producing a carrier flow F2. On the other hand, carriers injected from the first electrode 20 are suppressed from being laterally diffused and flow into the emission layer 40, resulting in a carrier flow F1. Accordingly, a current diffusion layer having a high impurity concentration may not be provided between the first electrode 20 and the emission layer 40.

Further, when FIG. 1B is viewed from above, the first contact layer 32 may be composed of a plurality of regions provided in a distributed manner in a direction of extension of the thin stripe portions 60b as illustrated in FIG. 1A. This structure can reduce spread of carriers within the first contact layer 32 along the direction of extension of the thin stripe portions 60b. Accordingly, a current injection efficiency can be increased more effectively. In the emission layer 40, light-emitting recombination is increased in proportion to an around square of a carrier density substantially, and non-light-emitting recombination is increased in around proportion to a carrier density substantially. Accordingly, as a whole, as a carrier density of a current is larger, a net light-emitting recombination rate is increased more and it is easy to obtain a higher luminous efficiency.

As illustrated in FIG. 1A, the openings 90a of the insulating layer 90 has a rectangular shape, but the planar shape of the openings 90a is not limited to the rectangular shape. The openings 90a of the insulating layer 90 may have a circular shape, an oval shape or a polygonal shape.

FIGS. 2A to 2E are cross-sectional views showing steps of an example of a method of manufacturing a semiconductor light-emitting device according to the first embodiment respectively. FIG. 2A is a schematic diagram illustrating a semiconductor layer of the semiconductor light-emitting device in a wafer state. FIG. 2B is a schematic diagram illustrating a wafer obtained by patterning an insulating layer. FIG. 2C is a schematic diagram illustrating a wafer obtained by forming a transparent conductive film. FIG. 2D is a schematic diagram illustrating a bonding step of the wafer. FIG. 2E is a schematic diagram illustrating a chip-level semiconductor light-emitting device obtained by dividing the wafer.

In FIG. 2A, a second conductivity type layer 50, an emission layer 40 and a first conductivity type layer 37 are laminated on a substrate 70 in this order. The substrate 70 is provided for crystal growth which is formed of gallium arsenide (GaAs) as illustrated in FIG. 1A. Specifically, For the second conductivity type layer 50, a second contact layer 56 of n-type GaAs (carrier concentration: $1\times10^{18}$ cm$^{-3}$), a current diffusion layer 54 of n-type $In_{0.5}(Ga_{0.3}Al_{0.7})_{0.5}P$ (carrier concentration: $4\times10^{17}$ cm$^{-3}$), a second cladding layer 52 of n-type $In_{0.5}Al_{0.5}P$ (carrier concentration: $3\times10^{17}$ cm$^{-3}$), and a light guide layer 51 of n-type InGaAlP are sequentially formed by crystal growth as illustrated in FIG. 2A. For the crystal growth, a metal organic chemical vapor deposition (MOCVD) method or a molecular beam epitaxy (MBE) method may be used.

An emission layer 40 composed of a thin laminated film of well layers and barrier layers is formed on the light guide layer 51. In the embodiment, the emission layer 40 is a thin laminated film of an MQW structure having twenty well layers and twenty-one barrier layers, for example. Each of the well layers is formed of $In_{0.5}Ga_{0.5}P$ and has a thickness of 4 nm. Each of the barrier layers is formed of $In_{0.5}(Ga_{0.4}Al_{0.6})_{0.5}P$ and has a thickness of 7 nm. However, the structure of the emission layer 40 is not limited to the above described structure.

Then, as the first conductivity type layer 37, a light guide layer 28 of a p-type InGaAlP, a first cladding layer 29 of a p-type $In_{0.5}Al_{0.5}P$ (carrier concentration: $3\times10^{17}$ cm$^{-3}$), a composition gradient layer 31 of a p-type $In_x(Ga_{1-y}Al_y)_{1-x}P$ ($0<x\leq1$, $0<y\leq1$, carrier concentration: $1\times10^{19}$ cm$^{-3}$), and a first contact layer 32 of a p-type GaP (carrier concentration: $1\times10^{19}$ cm$^{-3}$) are sequentially formed on the emission layer 40. In some cases, the light guide layer 28 may not be provided.

In a case where a GaP layer having a bandgap wavelength λg shorter than an emission wavelength and having a refractive index equal to or lower than an average refractive index of the emission layer 40 is provided by crystal growth on a surface of the first cladding layer 29 formed of a material such as $In_{0.5}Al_{0.5}P$ or a lowermost layer formed of a material such as $In_{0.5}(Ga_{0.3}Al_{0.7})_{0.5}P$, a lattice mismatch is large so that a crystal defect occurs easily. However, crystal defect can be reduced if the composition gradient layer 31 in which the composition changes from the composition of the layer 29 or the lowermost layer to the composition of the first contact layer is provided between the surface of the layer 29 or the surface of the lowermost layer and the GaP layer. The composition of the gradient layer 31 is obtained by changing the composition ratio of a group III element in a lamination direction. In other words, crystal defect can be reduced by providing the composition gradient layer 31 which is formed of a p-type $In_x(Ga_{1-y}Al_y)_{1-x}P$ ($0<x\leq1$, $0<y\leq1$) and in which the composition ratio x of In and the composition ratio y of Al are lowered toward the GaP layer. The composition ratio of Ga is gradually increased, and the composition of the composition gradient layer 31 gradually approaches GaP. A metal organic chemical vapor deposition (MOCVD) method can be used to continuously change the composition ratio of the mixed crystal elements. For example, the composition ratio x of In and the composition ratio y of Al can easily be changed in a linear profile, a quadratic function profile or a steps-profile. The composition ratio x of In and the composition ratio y of Al can be accurately lowered toward the first contact layer 32 by automatically controlling supply of source gases.

According to experiments completed by the inventors, the crystallinity of the first contact layer 32 was improved when a thickness TG of the composition gradient layer 31 illustrated in FIG. 1C was equal to or greater than 0.01 μm and equal to or less than 0.1 μm, and more preferably, equal to or greater than 0.01 μm and equal to or less than 0.05 μm. Further, it was found that a contact resistance of the first contact layer 32 and the transparent conductive film 26 was kept low when a thickness of the first contact layer 32 was equal to or greater than 0.02 μm and equal to or less than 1 μm. It is unnecessary to provide a thick contact layer so as to match lattices.

Then, as illustrated in FIG. 2B, an insulating layer 90 is formed on the first contact layer 32, and openings 90a are formed in the insulating layer 90. Subsequently, as illustrated in FIG. 2C, a transparent conductive film 26 is formed of a material such as tin-doped indium oxide (ITO: indium tin oxide), tin oxide or zinc oxide on the insulating layer 90 and portions of the first contact layer 32 which are exposed by the openings 90a.

As illustrated in FIG. 2D, a reflective metal layer 25, a barrier metal layer 24 and a second bonding metal layer 23 are formed on the transparent conductive film 26 in this order. The reflective metal layer 25 includes at least one of gold (Au), silver (Ag) or an Ag alloy in which indium (In), copper (Cu), chromium (Cr) etc. is added to Ag. The barrier metal layer 24 includes at least one material of titanium (Ti), platinum (Pt) or nickel (Ni). The second bonding metal layer 23 includes Au, AuIn etc. On the other hand, a support substrate 10 formed of a material such as conductive Si is prepared, and a first bonding metal layer 22 such as AuIn is formed on the support substrate 10.

Subsequently, a surface of the second bonding metal layer 23 on a side of the layers of semiconductor which is formed above the substrate 70, and the first bonding metal layer 22 on a side of the support substrate 10 are superimposed, and wafer bonding is performed by heating and pressurization. A linear expansion coefficient of a silicon (Si) substrate is $4 \times 10^{-6}/°$ C., and a linear expansion coefficient of a GaAs substrate approaches $6 \times 10^{-6}/°$ C. Accordingly, stress in (after) the wafer bonding step is reduced. Further, since a bonding temperature between metals can be lower than a bonding temperature between semiconductor materials, breaking or cracking of the wafer can be suppressed. In addition, use of the Si substrate facilitates a process of dividing the wafer into a plurality of chips by dicing etc.

Subsequently, the substrate 70 is removed, and the second contact layer 56 is left only on a region corresponding to thin stripe portions 60b of a second electrode 60 which is to be formed later. As illustrated in FIG. 2E, the thin stripe portions 60b extends on the patterned second contact layer 56. A pad portion 60a connecting the thin stripe line portions 60b is formed on the current diffusion layer 54 in a region where the second contact layer 56 is not formed. The second electrode 60 including the pad portion 60a and the thin stripe line portions 60b may have a structure in which AuGe/Ti/(Ni)/Pt/Au are laminated from a side of the current diffusion layer 54.

Further, by using a reactive ion etching (RIE) method or a wet etching method, fine concavity and convexity 54a are provided in a portion of the surface of the layer of semiconductor constituting the current diffusion layer 54 in which the second electrode 60 is not formed. A total reflection occurs at an interface between the current diffusion layer 54, whose surface is flat, and an air layer and an encapsulation resin layer (refractive index: about 1.5). Accordingly, if a reflection from behind is not considered, a light extraction efficiency becomes ten and several % or less. Moreover, even when a reflection from behind by the reflective metal layer 25 is considered, a light extraction efficiency becomes twenty and several % or less. However, when the fine concavity and convexity 54a are provided on the surface of the current diffusion layer 54, a light extraction efficiency can be increased. As illustrated in FIG. 2E, a backside electrode 62 formed of Ti/Pt/Au is formed on a backside of the support substrate 10.

An Au layer as an example of the reflective metal layer 25 can contact the first contact layer 32, without contacting through the transparent conductive film 26. However, in this case, an alloy layer is formed during a step of sintering the second electrode 60 at an interface between GaP constituting the first contact layer 32, for example, and Au constituting the reflective metal layer 25, for example. In some cases, the alloy layer absorbs a part of the emitted light, resulting in reducing luminance.

In this regard, if carbon (C) of $1 \times 10^{19}$ cm$^{-3}$ is doped into the first contact layer 32, a low contact resistance of 1 to $2 \times 10^{-4}$ $\Omega$cm$^2$ can be obtained between the first contact layer 32 and the transparent conductive film 26. In this case, since the transparent conductive film 26 formed of indium tin oxide (ITO), for example, and GaP constituting the first contact layer 32, for example, has difficulty in forming an alloy layer, absorption of the emitted light by the alloy layer is small.

Silver (Ag) can also be used for the reflective metal layer 25. When an emission wavelength is 0.6 µm or less, a light reflectivity of Au is more reduced than that of Ag. Accordingly, by using Ag, a high luminance can be achieved. Further, by using the Ag alloy, an environmental resistance including a moisture resistance can be increased. As illustrated in FIG. 1B, when the reflective metal layer 25 is patterned such that Ag or the Ag alloy constituting the reflective metal layer 25 is not exposed to sides of the semiconductor light-emitting device, penetration of gas or moisture is suppressed, and thus a reduction in reflectivity by sulfurization can be decreased.

Figure 3:
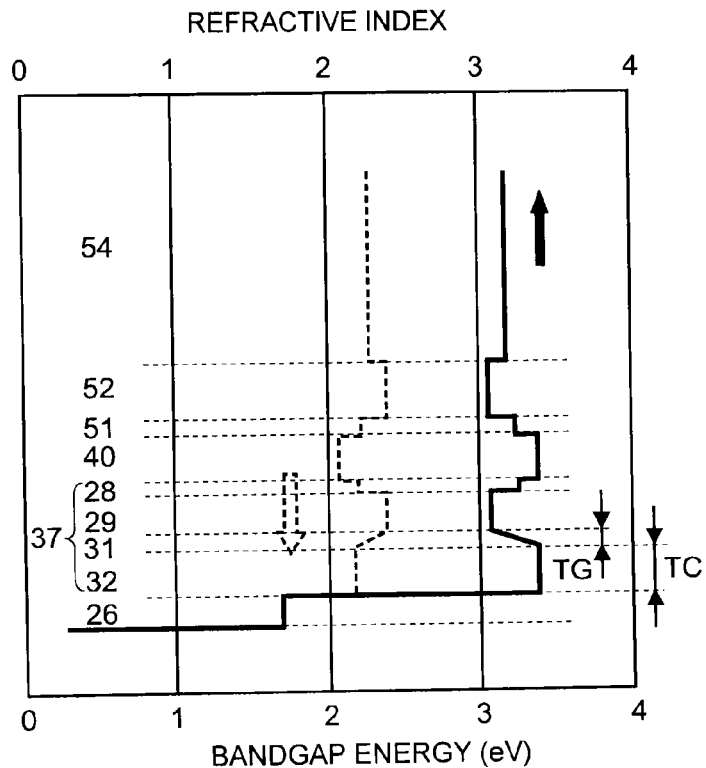
FIG. 3 is a graph diagram illustrating bandgap energy and a refractive index of the semiconductor light-emitting device according to the first embodiment.

FIG. 3 is a graph diagram illustrating bandgap energy and a refractive index of the semiconductor light-emitting device according to the first embodiment.

A solid line represents a refractive index distribution, and a dashed line represents a bandgap energy (eV) distribution. The current diffusion layer 54 is formed of n-type $In_{0.5}(Ga_{0.3}Al_{0.7})_{0.5}P$ (refractive index is about 3.2 at a wavelength of 0.6 µm). The second cladding layer 52 is formed of n-type $In_{0.5}Al_{0.5}P$ (refractive index is about 3.1 at an emission wavelength of 0.6 µm).

For example, the bandgap energy of the first contact layer 32 formed of GaP is about 2.26 eV which is larger than that of the emission layer 40, and the first contact layer 32 transmits light of a wavelength range of about 0.55 µm or more, without absorbing the corresponding light. The refractive index of the first contact layer 32 formed of GaP is about 3.4 at an emission wavelength of 0.6 µm. For example, the refractive index of the composition gradient layer 31 formed of $In_x(Ga_{1-y}Al_y)_{1-x}P$ ($0 < x \leq 1$, $0 < y \leq 1$) changes with the composition change and approaches the refractive index of GaP.

Figure 4:
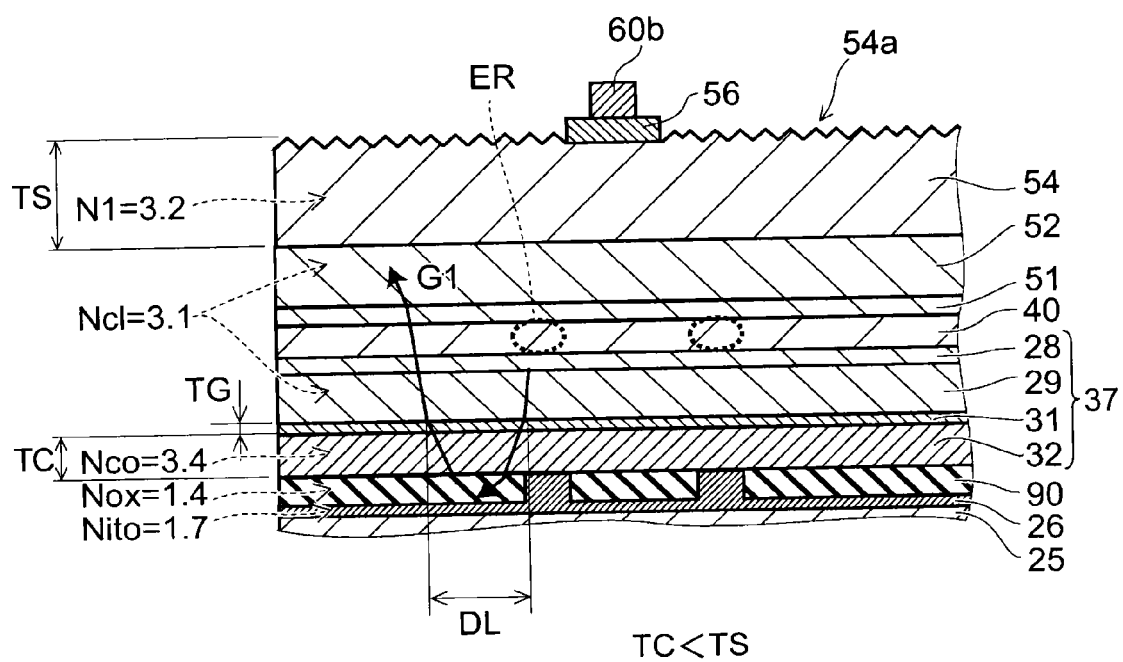
FIG. 4 is a schematic diagram illustrating an operation of the semiconductor light-emitting device according to the first embodiment.

FIG. 4 is a schematic diagram illustrating an operation of the semiconductor light-emitting device according to the first embodiment.

Light from the emission layer 40 is emitted upward (forward), laterally and downward (backward), in FIG. 4. Among lights directed downward, one of the lights whose incident angle is larger than a critical angle is totally reflected at an interface at which a refractive index changes from a high level to a low level, and is directed upward and further laterally. On the other hand, another one of the lights whose incident angle is smaller than a critical angle is reflected upward and laterally by the reflective metal layer 25 through the light guide layer 28, the first cladding layer 29, the first contact layer 32 and the transparent conductive film 26.

In the present embodiment, since the thickness TG of the composition gradient layer 31 and the thickness TC of the first contact layer 32 can become thin, a spread range DL of light in a lateral direction in FIG. 4 can be reduced. When the thickness TC of the first contact layer 32 is smaller than the thickness TS of the current diffusion layer 54, the carriers from the thin stripe portions 60b are injected into the emission layer 40 while being diffused laterally and outward in the current diffusion layer 54. On the other hand, since a distance to the emission layer 40 is short, the carriers from the first electrode 20 are injected into the emission layer 40 while spread of the carriers in the lateral direction is suppressed. Accordingly, a light extraction efficiency and a luminance can be enhanced by increasing light G1 directed upward.

When the transparent conductive film 26 is an ITO film, a refractive index $N_{ITP}$ is about 1.7 at an emission wavelength of 0.6 µm. The total reflection is suppressed because a refraction index is increased stepwise upward in a region from the transparent conductive film 26 through the first contact layer 32 (refractive index $N_{CO}$: 3.4) to the first cladding layer 29 (refractive index $N_{CL}$: 3.1).

When the composition gradient layer 31 is thinned, light passing through the composition gradient layer 31 reinforces a wave nature. Accordingly, the light path is not determined by Snell's law alone. Specifically, a total reflection of light incident on an interface at an angle larger than a critical angle is also reduced in a layer whose thickness is smaller than a light wavelength λg of a medium (=a wavelength of emitted light/a refractive index of the medium), resulting in an increase in transmittance. For example, when the wavelength of the emitted light is 0.6 μm and the refractive index of GaP is 3.4, the wavelength λg of the medium is 0.2 μm. 0.01 to 0.05 μm which is the thickness TG of the composition gradient layer 31 corresponds to a length of 0.05 to 0.25 which is the wavelength λg inside the medium. Accordingly, reflected light easily passes through the composition gradient layer 31.

Figure 5:
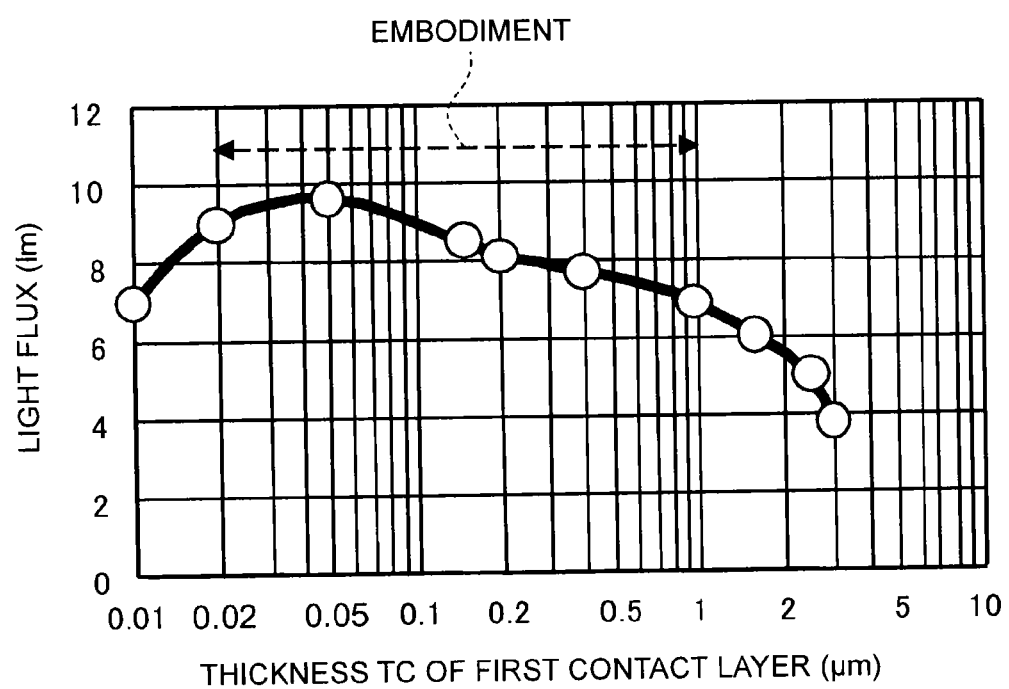
FIG. 5 is a graph diagram illustrating dependence of a light flux on a thickness of a first contact layer of the semiconductor light-emitting device according to the first embodiment.

FIG. 5 is a graph illustrating experimental results of dependence of the light flux on the thickness of the first contact layer of the semiconductor light-emitting device according to the first embodiment.

A vertical axis represents the light flux (lm: lumen) generated by a driving current of 50 mA, and a horizontal axis represents the thickness TC (μm) of the first contact layer. The semiconductor light-emitting device outputting the light flux is a device formed of an InGaAlP-based material which exhibits the characteristics illustrated in FIG. 3. The thickness TG of the composition gradient layer 31 is in a range from 0.01 to 0.1 μm. The thickness of the current diffusion layer 54 is 2.5 μm.

When the thickness TC of the first contact layer 32 was 0.02 μm, the output light flux was 9 lumens (lm). In the first contact layer 32 thinner than 0.02 μm, the light flux was reduced as the thickness of the first contact layer 32 became thinner. When the thickness TC of the first contact layer 32 was, for example, 0.01 μm, the light flux was 7 lumens (lm). As the thickness TC becomes thinner, a forward voltage is exponentially increased. Accordingly, it is preferable that the thickness TC is equal to or greater than 0.02 μm. Further, when the thickness TC of the first contact layer 32 was 0.05 μm, the light flux at a driving current of 50 mA exhibited the maximum value of about 9.6 lumens (lm). When the thickness TC was 2.5 μm which was the same as the thickness TS of the current diffusion layer 54, the light flux was reduced to 5 lumens (lm). When the thickness TC was thicker, the light flux was rapidly reduced. It was found that when the thickness TC of the first contact layer 32 was equal to or greater than 0.02 μm and equal to or less than 1.0 μm, the spread range DL in a lateral direction between the emission layer 40 and the reflective metal layer 25 was reduced and the light flux which is extractable upward was increased, resulting in high luminance.

Figure 6A:
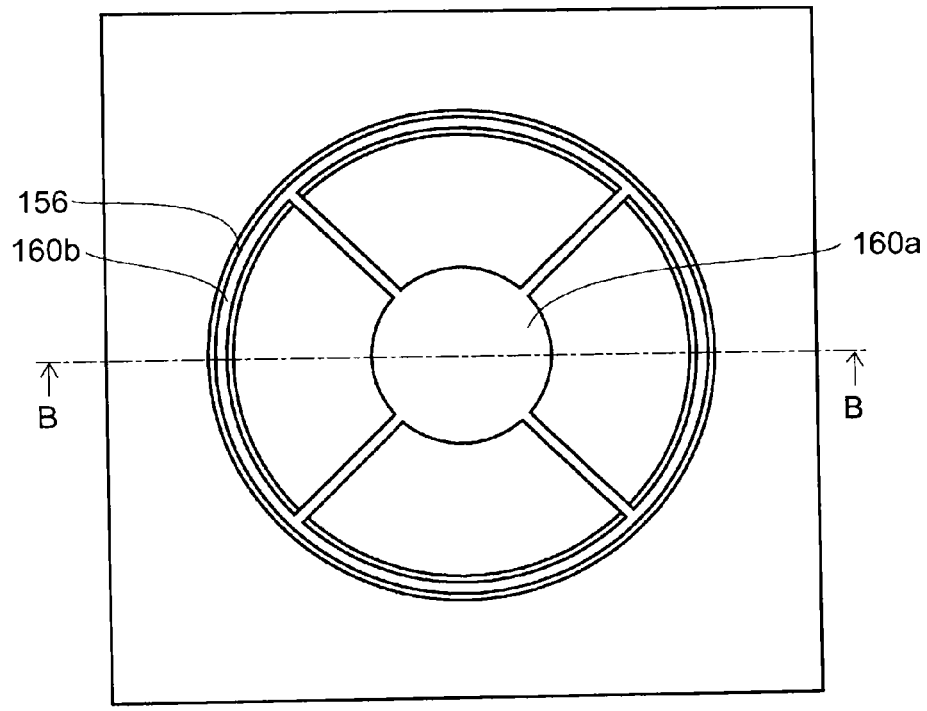
FIG. 6A is a schematic top view of a semiconductor light-emitting device according to a comparative example.
Figure 6B:
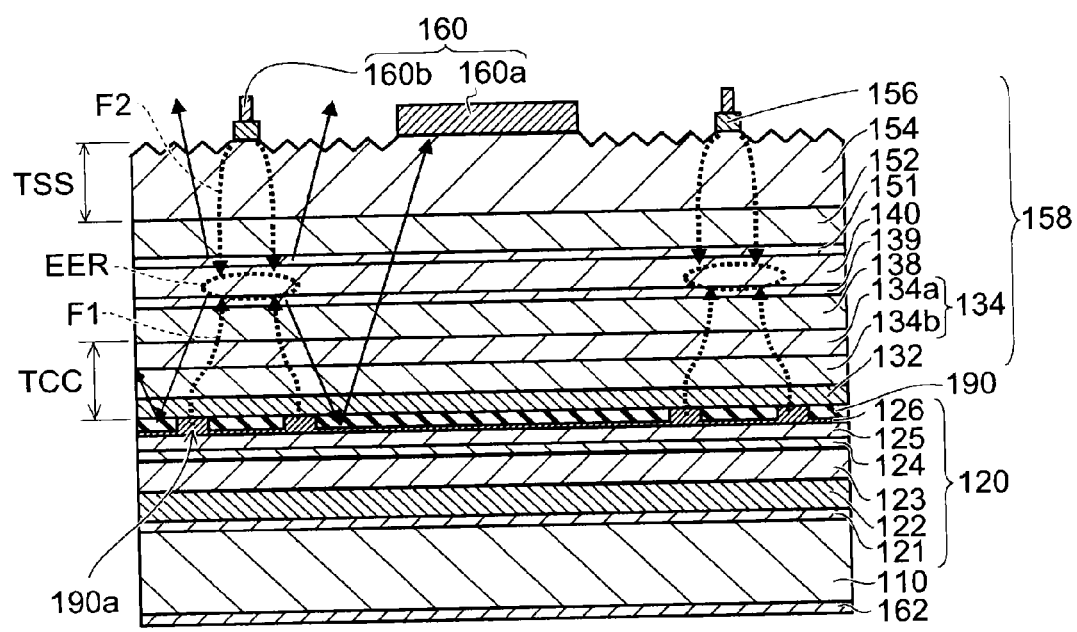
FIG. 6B is a schematic cross-sectional view taken along line B-B of FIG. 6A.

FIG. 6A is a schematic top view of a semiconductor light-emitting device according to a comparative example. FIG. 6B is a schematic cross-sectional view taken along line B-B of FIG. 6A.

An emission layer 140 constituting a semiconductor layer 158 may have an MQW structure in which well layers formed of $In_{0.5}(Ga_{1-x}Al_x)_{0.5}P$ (0≤x≤1) and barrier layers formed of $In_{0.5}(Ga_{1-y}Al_y)_{0.5}P$ (x<y, 0≤y≤1) are alternately laminated.

A light guide layer 139 is formed of p-type InGaAlP. A first cladding layer 138 is formed of p-type $In_{0.5}Al_{0.5}P$. A first current diffusion layer 134 is provided with a layer 134a of p-type $In_{0.5}(Ga_{0.3}Al_{0.7})_{0.5}P$ having a thickness of 0.5 μm and a layer 134b of p-type GaP having a thickness of 1.5 μm. Further, a first contact layer 132 is formed of a layer of p-type GaP having a thickness of 0.1 μm. In this case, the sum of the thicknesses of the layer 134a, 134b constituting the first current diffusion layer 134 and the first contact layer 132 is as large as 2.1 μm. Such a setting can spread a current within the surface of the emission layer 140 and reduce a contact resistance with a transparent conductive film (ITO film) 126.

A second contact layer 156 is formed of n-type GaAs. A second current diffusion layer 154 is formed of n-type $In_{0.5}(Ga_{0.3}Al_{0.7})_{0.5}P$. A second cladding layer 152 is formed of n-type $In_{0.5}Al_{0.5}P$. A light guide layer 151 is formed of n-type InGaAlP. The sum of the thicknesses of the second current diffusion layer 154, the second cladding layer 152, and the light guide layer 151 is 3.2 μm.

A pad portion 160a and thin stripe portions 60b constituting a second electrode 160 are formed on the second current diffusion layer 154 and the patterned second contact layer 156, respectively.

In the comparative example, a current blocking layer formed of an insulating layer 190 is provided between the semiconductor layer 158 and the first electrode 120. The transparent conductive layer 126, a reflective metal layer 125, a barrier metal layer 124, and first and second bonding metal layers 122, 123, which constitute the first electrode 120 respectively, are provided to cover the first contact layer 132 and the insulating layer 190 exposed to openings 190a. A support substrate 110 and a backside electrode 162 are further provided.

Figure 7:
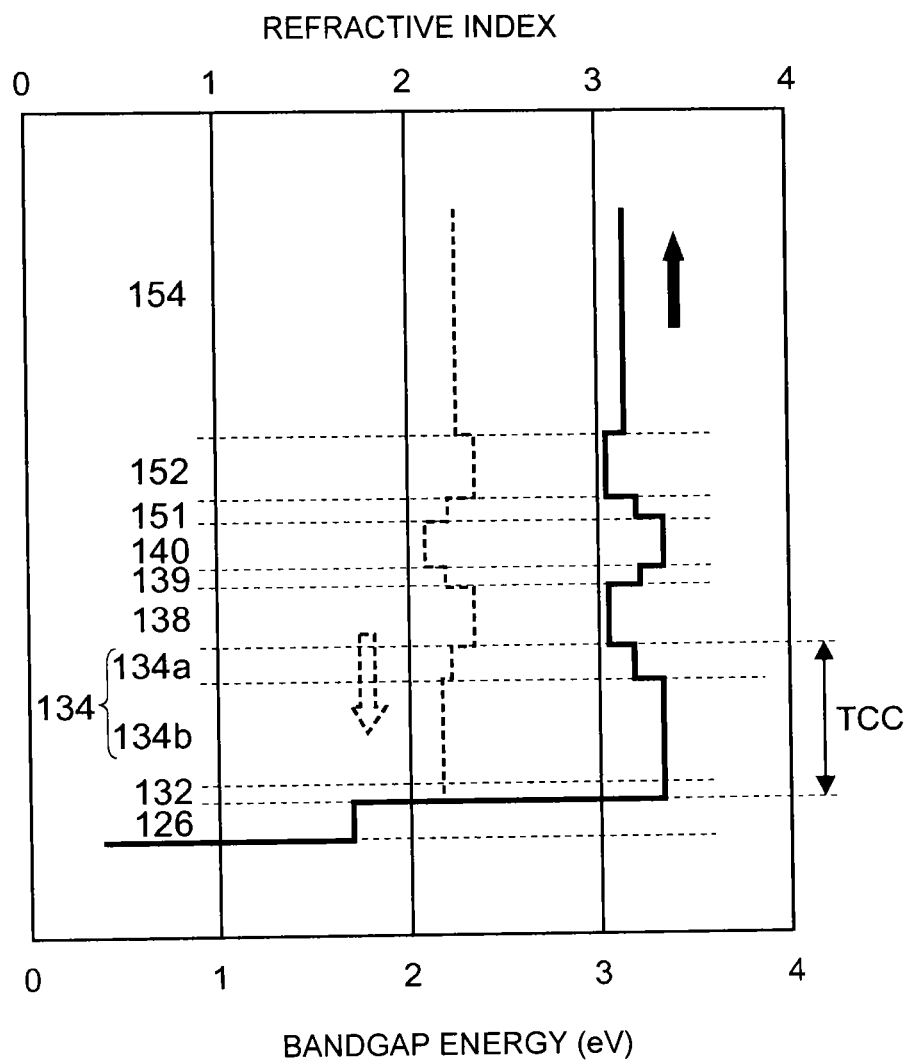
FIG. 7 is a graph diagram illustrating a distribution of bandgap energy and a refractive index of the comparative example.

FIG. 7 is a graph illustrating bandgap energy and a refractive index of a semiconductor light-emitting device according to the comparative example.

A solid line represents a refractive index distribution, and a dashed line represents a bandgap energy (eV) distribution. The bandgap energy of the emission layer 140 is lower than about 2.26 eV which is the bandgap energy of GaP. Also, the refractive index of GaP is about 3.4 at a wavelength of 0.6 μm.

Figure 8A:
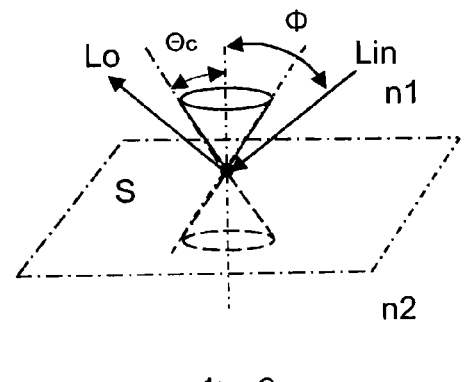
FIG. 8A is a schematic diagram of an escape cone.
Figure 8B:
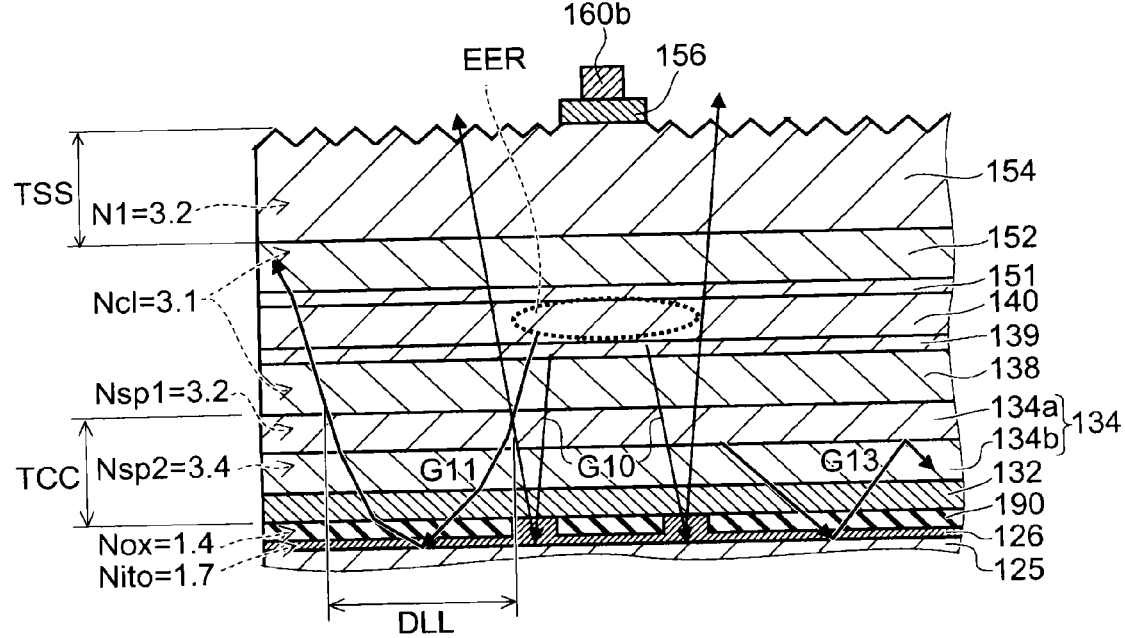
FIG. 8B is a schematic diagram for explaining an operation of the comparative example.

FIG. 8A is a schematic diagram of an escape cone. FIG. 8B is a schematic diagram for explaining an operation of the comparative example.

In FIG. 8B, it is assumed that a refractive index above or in front of an interface S is n1 and a refractive index below or in rear of the interface S is n2 (n1>n2). When an incident angle φ of light Lin incident from above is greater than a critical angle Θc, a total reflection is caused at the interface S, and reflected light Lo cannot be emitted upward. On the other hand, when the incident angle φ of the incident light Lin is less than the critical angle Θc, light is transmitted below the interface S. In other words, light incident into a cone forming the critical angle Θc with respect to an axis perpendicular to the interface S can be transmitted.

In FIG. 8B, light G10 directed downward is reflected by the reflective metal layer 125, and is emitted from a light extraction surface provided upward. Since the total thickness TCC of the first current diffusion layer 134 and the first contact layer 132 is as large as 2.1 μm, for example, a lateral diffusion range DLL of light G11 having a greater incident angle than the light G10 is increased. Accordingly, for example, light directed outward is easily emitted from a side of the device, and light extraction efficiency is reduced at an upward position. On the other hand, light directed inward is blocked by the pad portion, and light extraction efficiency is reduced at the upward position.

When the incident angle to the interface of the layer 134a of p-type $In_{0.5}(Ga_{0.3}Al_{0.7})_{0.5}P$ and the layer 134b of p-type GaP is greater than the critical angle of 70 degrees, light G13 reflected by the reflective metal layer 125 is totally reflected, and the light G13 is directed downward again. Accordingly, light extraction efficiency is reduced at the upward position.

When the first current diffusion layer 134 is made thick, carriers injected from the first electrode 120 are diffused inward. As a result, an emission region EER is excessively enlarged together with carriers injected from the thin stripe portions 160b and diffused outward, and a current injection density is effectively reduced. Accordingly, light extraction efficiency is not sufficiently high.

In this regard, in the first embodiment, a lateral diffusion of light directed from the emission layer 40 to the reflective metal layer 25 and the reflected light can be suppressed by reducing the thickness TG of the composition gradient layer 31 and the thickness TC of the first contact layer 32. As a result, a light extraction efficiency is further enhanced at the upward position.

Figures 9A, 9B:
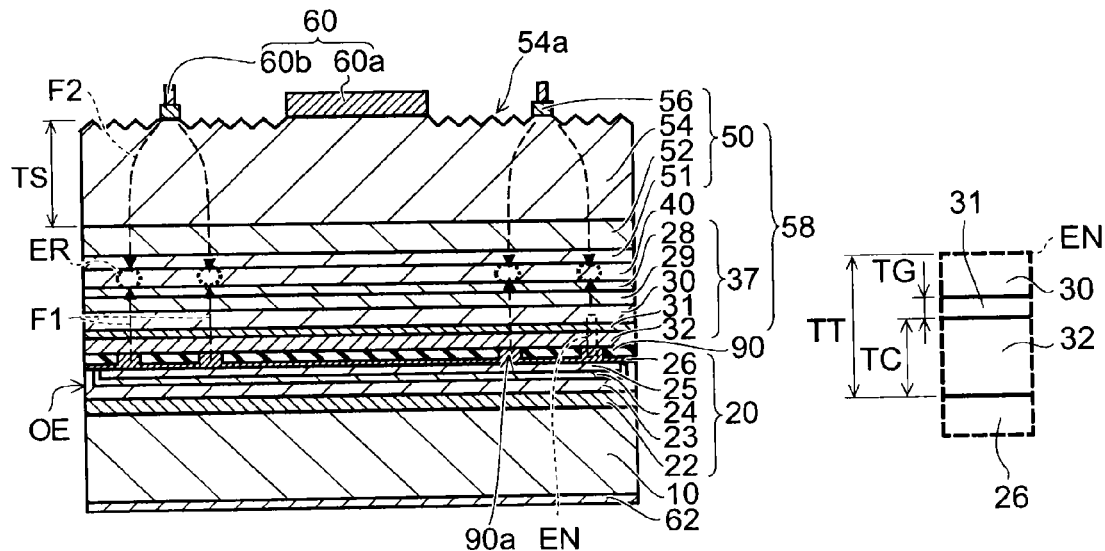
FIG. 9A is a schematic cross-sectional view of a semiconductor light-emitting device according to a modification of the first embodiment.
FIG. 9B is a schematic partial enlarged cross-sectional view of a region EN of FIG. 9A.
Figure 9C:
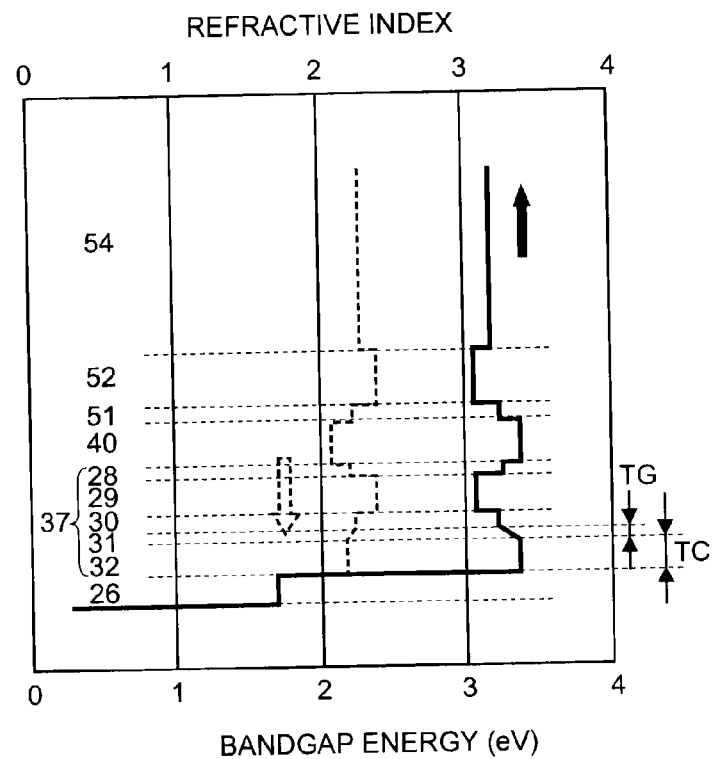
FIG. 9C is a graph diagram illustrating bandgap energy and a refractive index of the semiconductor light-emitting device of FIG. 9A.

FIG. 9A is a schematic cross-sectional view of a semiconductor light-emitting device according to a modification of the first embodiment. FIG. 9B is a schematic partial enlarged cross-sectional view of a region EN of FIG. 9A. FIG. 9C is a graph illustrating bandgap energy and a refractive index of the semiconductor light-emitting device of FIG. 9A.

In FIGS. 9A and 9B, the first conductivity type layer 37 has a current diffusion layer 30 in addition to the configurations illustrated in the first embodiment. Specifically, as the current diffusion layer 30, a layer formed of p-type $In_{0.5}(Ga_{0.3}Al_{0.7})_{0.5}P$, for example, is provided between the composition gradient layer 31 and the first cladding layer 29. In this case, it is preferable that the thickness of the current diffusion layer 30 is smaller than the thickness TC of the first contact layer 32 so as to suppress a lateral diffusion of light between the emission layer 40 and the reflective metal layer 25. The composition of the composition gradient layer 31 may be changed to approach from $In_{0.5}(Ga_{0.3}Al_{0.7})_{0.5}P$ to GaP.

Figure 10A:
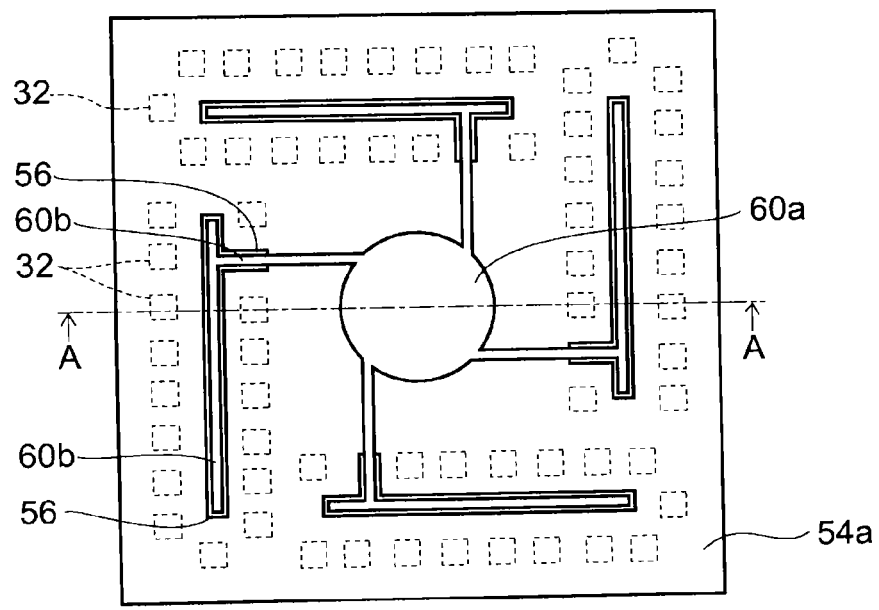
FIG. 10A is a schematic top view of a semiconductor light-emitting device according to a second embodiment.
Figure 10B:
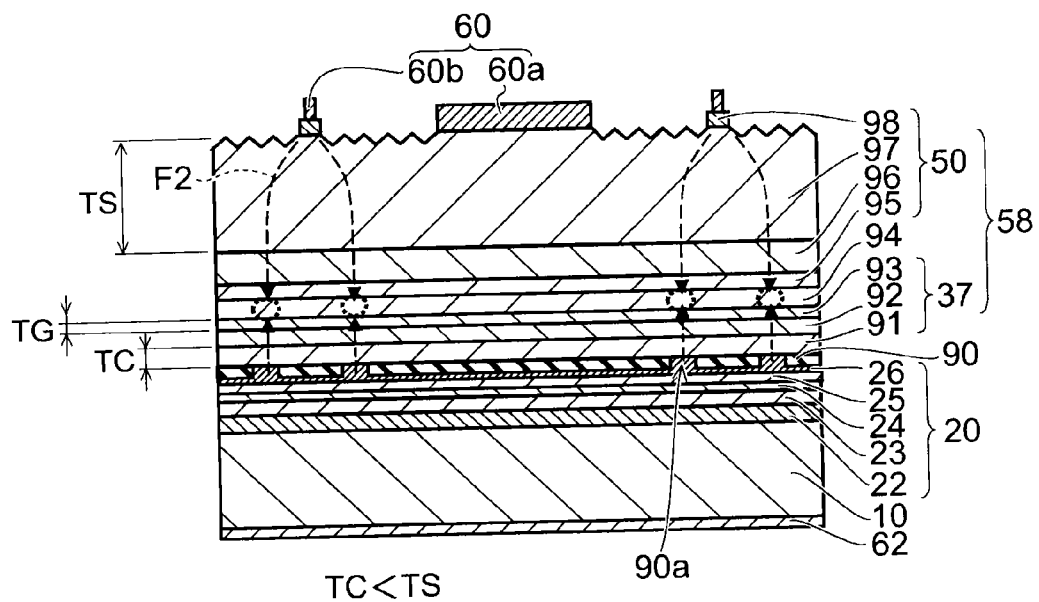
FIG. 10B is a schematic cross-sectional view taken along line A-A of FIG. 10A.

FIG. 10A is a schematic top view of a semiconductor light-emitting device according to a second embodiment. FIG. 10B is a schematic cross-sectional view taken along line A-A of FIG. 10A.

The semiconductor light-emitting device of the second embodiment is configured by a nitride-based material. The semiconductor light-emitting device has a support substrate 10, a first electrode 20 provided on the support substrate 10, a first conductivity type layer 37 provided on the first electrode 20, an emission layer 94 provided on the first conductivity type layer 37, a second conductivity type layer 50 provided on the emission layer 94, and a second electrode 60 provided on the second conductivity type layer 50.

In the first conductivity type layer 37, a first contact layer 91 formed of p-type GaN, a first cladding layer 92 formed of p-type $Al_{0.15}Ga_{0.85}N$, and a p-type first composition gradient layer 93 are formed in this order from a side of the first electrode 20. In the second conductivity type layer 50, a second composition gradient layer 95 of n-type, a second cladding layer 96 formed of n-type $Al_{0.15}Ga_{0.85}N$, a current diffusion layer 97 formed of n-type $Al_{0.05}Ga_{0.95}N$, and a second contact layer 98 formed of n-type GaN are formed in this order from a side of the emission layer 94.

The emission layer 94 has an MQW structure and is formed of $In_uGa_vAl_{1-u-v}N$ (0≤u≤1, 0≤v≤1, u+v≤1). In the MQW structure, a well layer may be $In_{0.1}Ga_{0.9}N$, and a barrier layer may be $In_{0.02}Ga_{0.98}N$.

It is preferable that the compositions of the first and second composition gradient layers 93, 95 are gradually changed from $In_{0.1}Ga_{0.9}N$ to $Al_{0.15}Ga_{0.85}N$, respectively, from a side of the emission layer 94 toward the cladding layers 92, 96. According to experiments done by the inventors, it was found that a lattice match with respect to GaN could easily be achieved and a forward voltage could be reduced when the thickness TG of the first composition gradient layer 93 was equal to or greater than 0.01 μm and equal to or less than 0.1 μm. Further, when the thickness TC of the first contact layer 91 is smaller than the thickness TS of the current diffusion layer 97, lateral diffusion of light reflected by the first electrode 20 can be suppressed. Moreover, it is preferable that the thickness TC of the first contact layer 91 is equal to or greater than 0.02 μm and equal to or less than 1.0 μm.

Figure 11A:
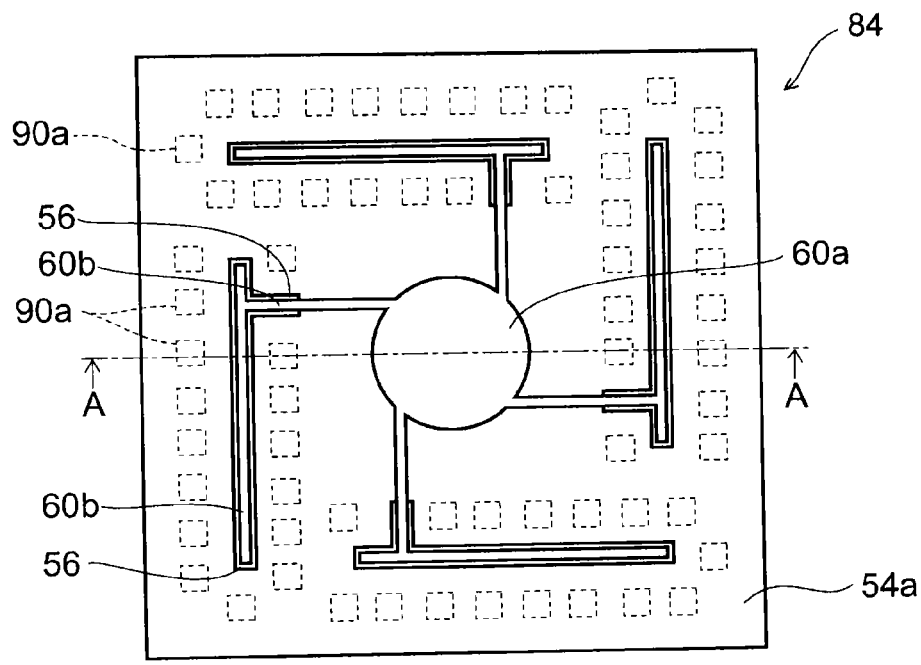
FIG. 11A is a schematic top view of a semiconductor light-emitting device according to a third embodiment.
Figure 11B:
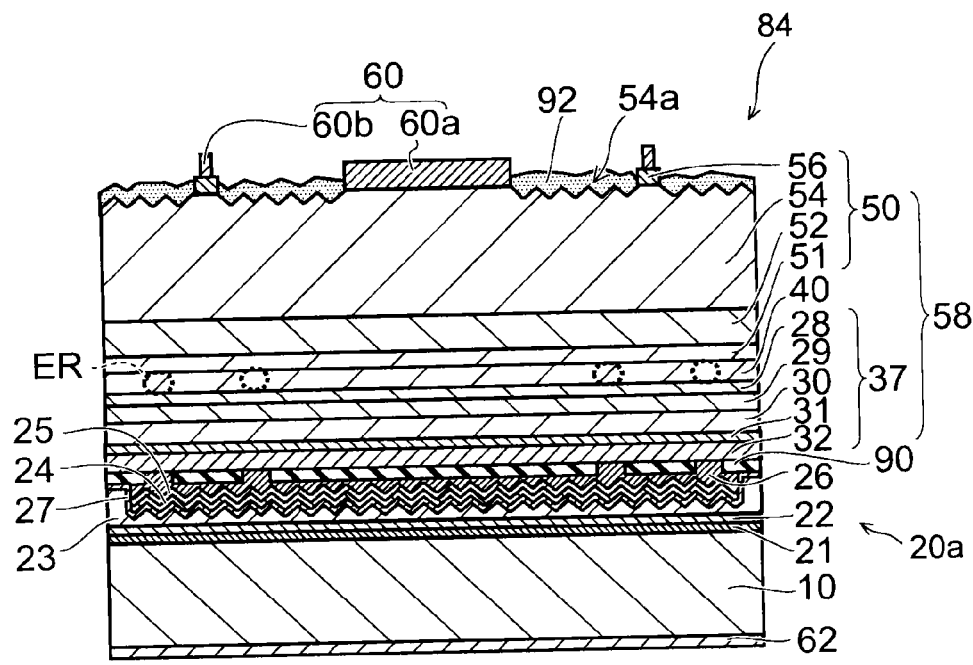
FIG. 11B is a schematic cross-sectional view taken along line A-A of FIG. 11A.

FIG. 11A is a schematic top view of a semiconductor light-emitting device according to a third embodiment. FIG. 11B is a schematic cross-sectional view taken along line A-A of FIG. 11A.

The semiconductor light-emitting device 84 of the present embodiment has a support substrate 10, a first electrode 20a provided on the support substrate 10, a first conductivity type layer 37 provided on the first electrode 20a, an emission layer 40 provided on the first conductivity type layer 37, a second conductivity type layer 50 provided on the emission layer 40, and a second electrode 60 provided on the second conductivity type layer 50. A silicon oxide film 92a is formed on concavity and convexity 54a of a current diffusion layer 54. The first conductivity type layer 37, the emission layer 40 and the second conductivity type layer 50 are similar to those of the modification of the first embodiment illustrated in FIGS. 9A to 9C. In the first electrode 20a, a first bonding electrode 22, a second bonding electrode 23, an Au film 27, a barrier metal layer 24, a reflective metal layer 25 and a transparent conductive film 26 are formed in this order from a side of the support substrate 10.

In the third embodiment, the reflective metal layer 25 has a Lambertian reflection structure. Specifically, fine concavity and convexity are provided on the surface of the reflective metal layer 25. The fine concavity and convexity may be regular or irregular, but a light diffusion effect can be enhanced when a pitch of the concavity and convexity is equal to or longer than a wavelength of light emitted from the emission layer 40 within a medium.

In FIGS. 11A and 11B, an insulating layer 90 including openings 90a is provided on the surface of the first contact layer 32. The emission layer 40 is formed of InAlGaP-based material and has an emission wavelength of 600 nm. An average depth of the fine concavity and convexity is, for example, 50 to 200 nm. The reflective metal layer 25 is formed of a material such as Ag and an Ag alloy. An average pitch of the reflective metal layer 25 is, for example, 350 to 1,200 nm. According to experiments done by the inventors, it was found that a luminance of the semiconductor light-emitting device having the above-described structure was higher than that of a light-emitting device in which a Lambertian reflection structure is not provided, by 15% or more.

Figure 12:
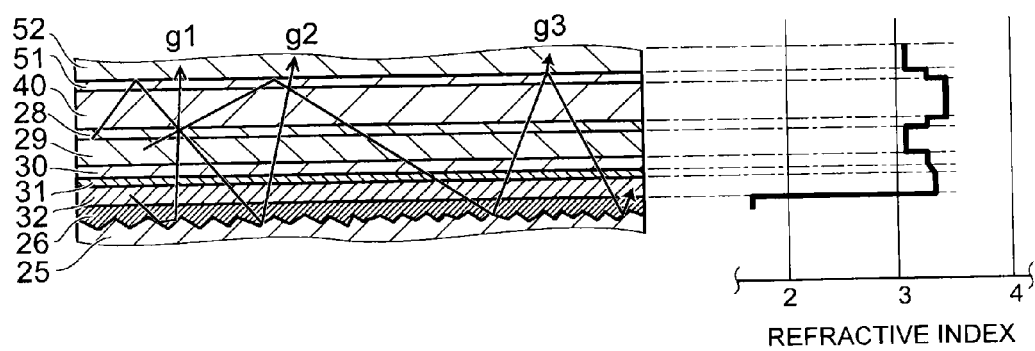
FIG. 12 is a schematic diagram for explaining a Lambertian reflection structure.

FIG. 12 is a schematic diagram for explaining the Lambertian reflection structure.

In this case, the first contact layer 32 is composed of a GaP layer, and the transparent conductive film 26 is composed of an ITO layer. Light having an incident angle smaller than 30 degrees is incident on the ITO layer, is reflected by the reflective metal layer 25, and is then diffused, as indicated by lights g1, g2 and g3. The incident angle of 30 degrees is a critical angle when the light is incident from the GaP layer (refractive index: about 3.4) to the ITO layer (refractive index: about 1.7). When the emission layer 40 emits light having a wavelength of 600 nm, the average pitch of the concavity and convexity is 700 nm, and the average depth of the concavity and convexity is 20 nm, the rate of conversion from radiated linear light to diffused light is 40%, for example. The conversion rate increases with increase in the average depth of the concavity and convexity. Accordingly, the luminance can be increased.

FIGS. 13A to 13J are cross-sectional views respectively for illustrating steps of an example of a method of manufacturing the semiconductor light-emitting device according to the third embodiment. FIGS. 13A to 13F illustrate steps until a second bonding electrode is formed on a substrate on which crystal growth is performed. FIGS. 13G to 13J illustrate steps after a wafer bonding step.

As illustrated in FIG. 13A, a second conductivity type layer 50, an emission layer 40 and a first conductivity type layer 37 are formed on a substrate 70 formed of GaAs, for example, by using an MOCVD method. Specifically, an etching stopper layer 59 and a second contact layer 56 of n-type GaAs (carrier concentration: $1 \times 10^{18}$ cm$^{-3}$) are formed on the substrate 70. In a manner similar to the step of FIG. 2A, a current diffusion layer 54, a second cladding layer 52 and a light guide layer 51 are sequentially formed on the second contact layer 56. Similarly to the step of FIG. 2A, the emission layer 40 is sequentially crystal-grown in the light guide layer 51 by using a metal organic chemical vapor deposition (MOCVD) method or a molecular beam epitaxy (MBE) method, for example. Similarly to the step of FIG. 2A, a light guide layer 28 and a first cladding layer 29 are formed on the emission layer 40. A current diffusion layer 30 formed of p-type $In_{0.5}(Ga_{0.3}Al_{0.7})_{0.5}P$ is formed on the first cladding layer 29. Similarly to the step of FIG. 2A, a composition gradient layer 31 and a first contact layer 32 are sequentially formed on the current diffusion layer 30. In some cases, the light guide layer 28 may not be provided.

As illustrated in FIG. 13B, an insulating layer 90 such as $SiO_2$ is formed on the surface of the first contact layer 32 constituting the first conductivity type layer 37, and openings 90a are selectively provided in a region to be a current path. As illustrated in FIG. 13C, a transparent conductive film 26 such as ITO, tin oxide or zinc oxide is formed to cover a portion of the first contact layer 32 exposed to the openings 90a and the insulating layer 90 around the opening 90a.

As illustrated in FIG. 13D, concavity and convexity 26a are formed by processing the surface of the transparent conductive film 26 using chemical processing, RIE, etc. In this case, the thickness of the ITO and the depth of a concave portion are selected so that the first contact layer 32 is not exposed to a bottom portion of the concavity and convexity 26a. Such exposure of the first contact layer 32 is not preferable because a reflective metal layer to be subsequently formed comes into direct contact with the first contact layer 32.

On the other hand, when the transparent conductive film 26 is excessively thick, light absorption within the transparent conductive film 26 may be increased, and thus the luminance may be reduced by about 10%. Accordingly, it is preferable that the thickness of the transparent conductive film 26 is in a range of 100 to 300 nm, and the average depth of the concavity and convexity 26a is in a range of 50 to 200 nm.

Subsequently, as illustrated in FIG. 13E, a reflective metal layer 25 formed of Ag or an Ag alloy and a barrier metal layer 24 containing at least one of Ti, Pt and Ni are sequentially formed on the concavity and convexity 26a formed in the transparent conductive film 26.

Then, as illustrated in FIG. 13F, the barrier metal layer 24 is covered with a metal such as an Au film 27. A second bonding metal layer 23 formed of a material such as AuIn or Au is formed to cover the Au film 27. Alternatively, in a dicing line region, after respective portions of the transparent conductive film 26, a reflective metal layer 25 and a barrier metal layer 24 are removed, an Au film 27 and a second bonding metal layer 23 may be formed in this order so as to cover the entire wafer. Such formation is more preferable as sulfurization or migration of Ag is suppressed, since Ag or the Ag alloy is not exposed to a side surface of the light-emitting device, as illustrated in FIG. 11B.

Figures 13G, 13H:
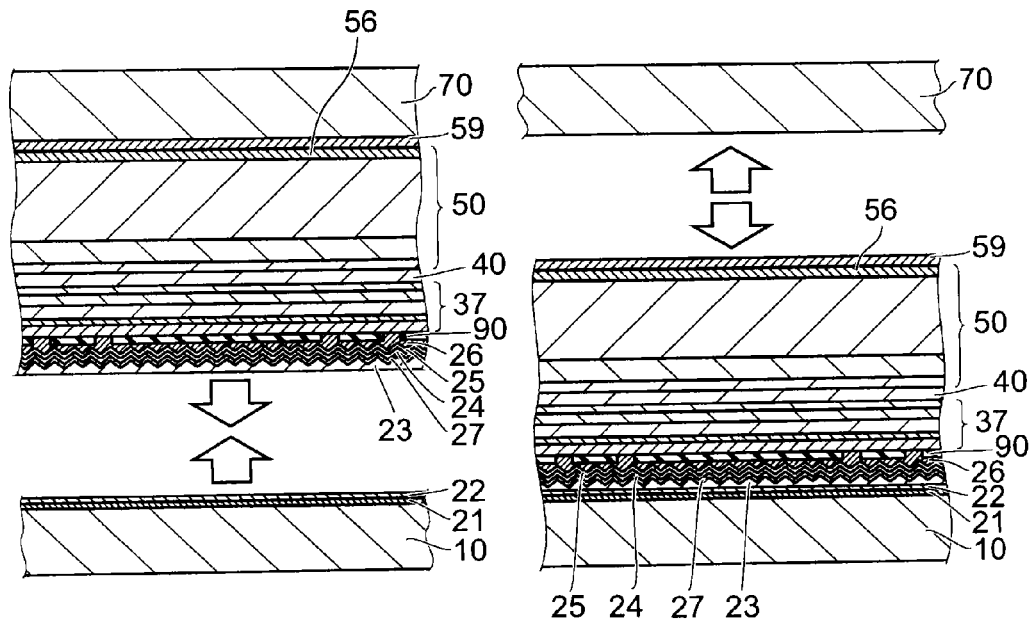
FIG. 13G is a cross-sectional view illustrating a step of an example of a method of manufacturing the semiconductor light-emitting device according to the third embodiment.
FIG. 13H is a cross-sectional view illustrating a step of an example of a method of manufacturing the semiconductor light-emitting device according to the third embodiment.

As illustrated in FIG. 13G, a support substrate 10 formed of silicon (Si) is prepared. A barrier metal layer 21 is formed on the support substrate 10, and a first bonding metal layer 22 formed of a material such as AuIn is formed on the barrier metal layer 21. The support substrate 10 and a laminate formed on a side of a substrate 70 by the steps until the step of FIG. 13F are bonded in a wafer state by heating after superimposing the first bonding metal layer 22 and the second bonding metal layer 23. Even when concavity and convexity corresponding to the concavity and convexity 26a are left on the surface of the second bonding metal layer 23, the second bonding metal layer 23 can maintain high adhesion to the first bonding metal layer 22 because a solder material such as AuIn constituting the first and second bonding metal layers 22, 23 is melted.

Figures 13I, 13J:
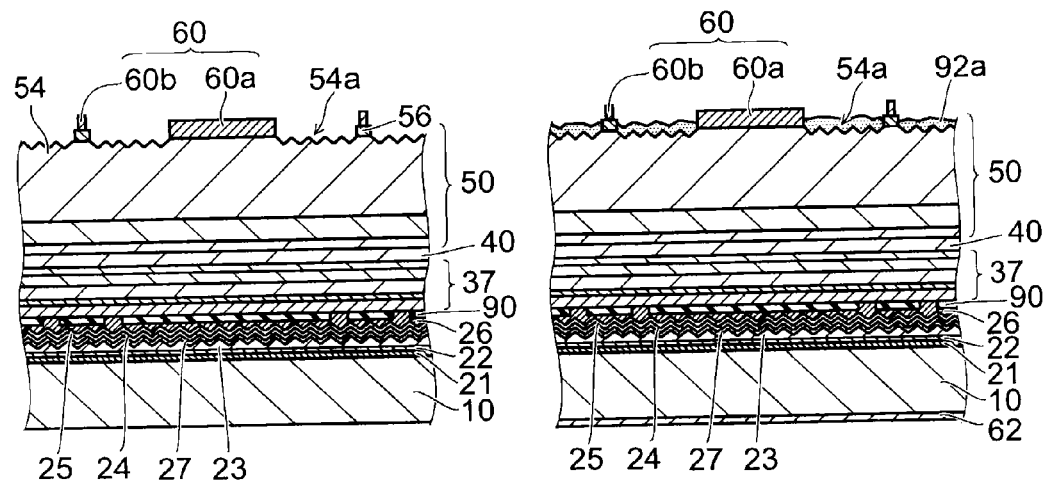
FIG. 13I is a cross-sectional view illustrating a step of an example of a method of manufacturing the semiconductor light-emitting device according to the third embodiment.
FIG. 13J is a cross-sectional view illustrating a step of an example of a method of manufacturing the semiconductor light-emitting device according to the third embodiment.

Then, as illustrated in FIG. 13H, the substrate 70 is removed. In a case where the substrate 70 is removed by the chemical processing, the second contact layer 56 can surely remain because an etching stopper layer 59 is provided. After the removal of the substrate 70, the etching stopper layer 59 is also removed. Further, as illustrated in FIG. 13I, in a similar manner to the step of FIG. 2F, a second electrode 60 is formed on the surfaces of the current diffusion layer 54 and the second contact layer 56. Concavity and convexity 54a may be provided in a portion of the surface of the second conductivity type layer 50 which is a region where the second electrode 60 is not formed.

Subsequently, as illustrated in FIG. 13J, a silicon oxide film 92a is formed on the concavity and convexity 54a. A backside electrode 62 is formed on a backside of the support substrate 10, and a wafer of a semiconductor light-emitting device is completed.

Figure 14A:
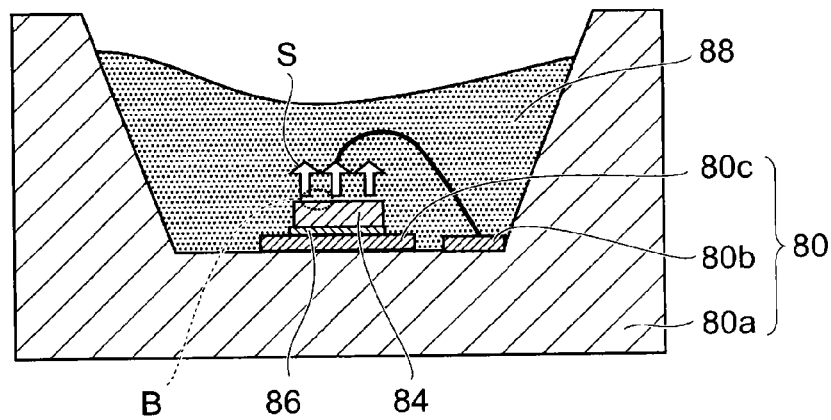
FIG. 14A is a schematic cross-sectional view of a light emitting device using a semiconductor light-emitting device according to the third embodiment.
Figure 14B:
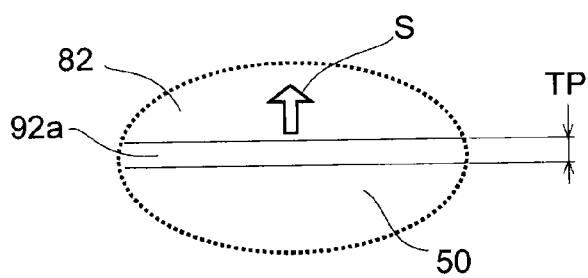
FIG. 14B is a schematic partial enlarged cross-sectional view of a region B of FIG. 14A.
Figure 14C:
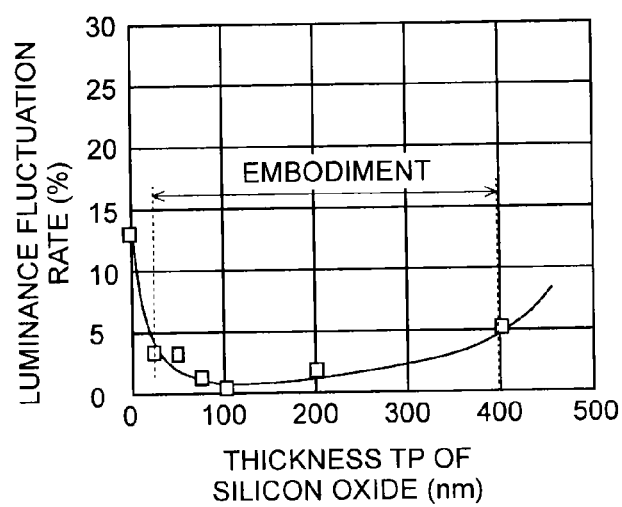
FIG. 14C is a graph diagram illustrating a luminance fluctuation rate of the semiconductor light-emitting device of the light emitting device.

FIG. 14A is a schematic cross-sectional view of a light emitting device using the semiconductor light-emitting device according to the third embodiment. FIG. 14B is a schematic partial enlarged cross-sectional view of a region B of FIG. 14A. FIG. 14C is a graph which illustrates a luminance fluctuation rate of the light emitting device obtained after an acceleration test of moisture absorption and reflow treatment.

The light emitting device according to the embodiment has a mounting member 80. As illustrated in FIG. 14A, the mounting member 80 has a mold 80a of an insulating material such as a resin, a lead terminal 80b and a pedestal 80c. The lead terminal 80b and the pedestal 80c are provided on the mold 80a. The semiconductor light-emitting device 84 is adhered on the pedestal 80c by using a conductive adhesive 86. The semiconductor light-emitting device 84 is encapsulated by an encapsulation layer 88 formed of resin such as epoxy or silicone.

As illustrated in FIG. 14B, a silicon oxide film 92a shown in FIG. 11B and having a thickness TP is provided on a region of the surface of the second conductivity type layer 50 where the second electrode 60 is not formed. According to experiments done by the inventors, when the encapsulation layer 88 formed of resin contacted the surface of the second conductivity type layer 50 directly, a shrinkage stress S was applied between the encapsulation layer 88 and the second conductivity type layer 50 in an acceleration test of moisture absorption and reflow treatment at 260° C., and peeling of the encapsulation layer 88 occurred in some cases. When such peeling occurs, the luminance fluctuation rate is increased.

FIG. 14C is a graph illustrating dependence of the luminance fluctuation rate (%) with respect to the thickness TP (nm) of the silicon oxide film. When the thickness TP of the silicon oxide film 92a was 25 to 400 nm, the luminance fluctuation rate after the acceleration test of moisture absorption and reflow treatment at 260° C. could be suppressed to 5% or less. On the other hand, in a case of using a SiON film of a 100 nm thickness instead of the silicon oxide film 92a, peeling occurred easily, and the luminance fluctuation rate was increased to about 12%. Accordingly, for in-vehicle use in which environmental condition is strict, it is preferable that the surface of the second conductivity type layer 50 is covered with the silicon oxide film 92a having a thickness in a range of 25 to 400 nm. The silicon oxide film 92a and the encapsulation layer 88 can enhance mutual adhesion by forming a hydrogen bond etc. between the silicon oxide film and the encapsulation layer 88.

Figure 15:
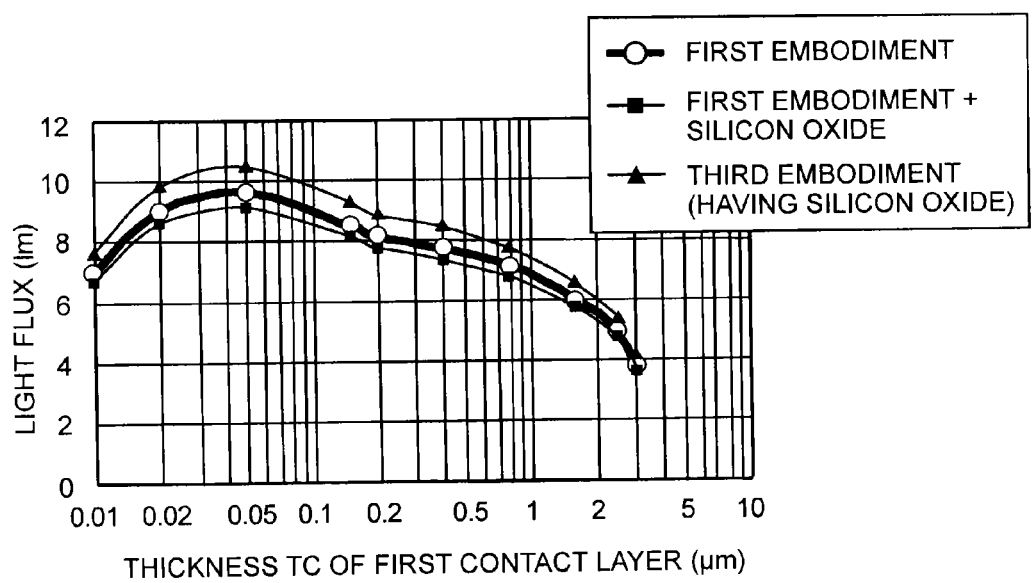
FIG. 15 is a graph diagram illustrating dependence of a light flux on a thickness of a first contact layer of the semiconductor light-emitting device according to the third embodiment.

FIG. 15 is a graph illustrating dependence of the light flux on the thickness of the first contact layer 32 of the semiconductor light-emitting device according to the third embodiment.

For comparison, the light flux of the first embodiment which does not have the silicon oxide film is marked with ○. The dependence of the light flux of the first embodiment is illustrated in FIG. 5. The light flux obtained when the silicon oxide film 92a is provided on the surface of the semiconductor light-emitting device of the first embodiment is marked with ■. Further, the light flux of the third embodiment which has the silicon oxide film is marked with ▲.

As illustrated in FIG. 11B, when the silicon oxide film 92a is provided on the concavity and convexity 54a of the surface of the second conductivity type layer 50, the light flux is reduced by about 5% because the steepness of the concavity and convexity is reduced. However, since the reflective metal layer 25 has the concavity and convexity surface, available light flux is increased by about 10% as compared with the first embodiment in which the silicon oxide film is not used. The third embodiment in which the silicon oxide film 92a is provided on the light extraction surface can easily achieve high luminance while maintaining reliability.

The semiconductor light-emitting devices according to the first to third embodiments and the modifications can easily enhance light extraction efficiency and luminance, and can be widely used in a lighting device, a display device, a traffic light etc.

While certain embodiments have been described, these embodiments have been presented by way of example only, and are not intended to limit the scope of the inventions. Indeed, the novel embodiments described herein may be embodied in a variety of other forms; Further, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light-emitting device, comprising:
an emission layer comprising a group III-V compound semiconductor;
a first electrode comprising a reflective metal layer and a transparent conductive film;
an insulating layer provided on the first electrode and having an opening such that a part of the transparent conductive film is included in the opening;
a first conductivity type layer provided between the insulating layer and the emission layer, and comprising a group III-V compound semiconductor;
a second conductivity type layer provided on the emission layer and comprising a second contact layer; and
a second electrode comprising a strip portion provided on the second contact layer,
wherein the first conductivity type layer comprises a first contact layer, a first cladding layer, and a composition gradient layer, and a composition of the composition gradient layer varies in a thickness direction of the composition gradient layer.

2. The semiconductor light-emitting device according to claim 1, wherein the insulating layer has a plurality of openings including the opening, and the plurality of openings is provided in a distributed manner in a direction in which the strip portion extends.

3. The semiconductor light-emitting device according to claim 1, wherein the composition of the composition gradient layer varies in the thickness direction of the composition gradient layer such that the composition of the composition gradient layer is similar to a composition of the first contact layer at a side of the first contact layer and is similar to a composition of the first cladding layer at a side of the first cladding layer.

4. A semiconductor light-emitting device, comprising:
an emission layer comprising a group III-V compound semiconductor;
a first electrode having a transparent conductive film, a reflective metal layer, a barrier metal layer, and a bonding metal layer provided in an order of the transparent conductive film, the reflective metal layer, the barrier metal layer, and the bonding metal layer from a side of the emission layer, such that a surface of the reflective metal layer contacting the transparent conductive film has concavity and convexity;
an insulating layer provided on the first electrode and having an opening such that a portion of the first electrode is exposed to the opening;
a first conductivity type layer provided between the emission layer and the insulating layer, comprising a group III-V compound semiconductor having bandgap energy larger than bandgap energy of the emission layer, and including a first contact layer and a composition gradient layer in an order of the first contact layer and the composition gradient layer from a side of the emission layer;
a second conductivity type layer provided on the emission layer and having a current diffusion layer and a second contact layer provided in an order of the current diffusion layer and the second contact layer from a side of the emission layer; and
a second electrode provided on a region of the second conductivity type layer where the second contact layer is not formed,
wherein the second contact layer is not superimposed on the opening of the insulating layer when seen from a side of the second electrode, and a thickness of the current diffusion layer is larger than a thickness of the first contact layer.

5. The semiconductor light-emitting device according to claim 4, wherein the first electrode further has an Au film between the barrier metal layer and the bonding metal layer, a side surface of the first electrode is formed by the bonding metal layer and the Au film, and the Au film contacts the insulating layer.

6. The semiconductor light-emitting device according to claim 4, wherein the transparent conductive film has a thickness of 100 to 300 nm.

7. The semiconductor light-emitting device according to claim 4, wherein the concavity and convexity of the surface of the reflective metal layer have an average pitch of 350 to 1,200 nm and an average depth of 50 to 200 nm.

8. The semiconductor light-emitting device according to claim 4, wherein the transparent conductive film includes at least one of tin-doped indium oxide, tin oxide, and zinc oxide.

9. The semiconductor light-emitting device according to claim 4, wherein the reflective metal layer includes at least one of Ag, an Ag alloy, and Au.

10. The semiconductor light-emitting device according to claim 4, wherein the barrier metal layer includes at least one of Ti, Pt, and Ni.

11. The semiconductor light-emitting device according to claim 4, wherein the bonding metal layer includes at least one of AuIn and Au.

12. The semiconductor light-emitting device according to claim 4,
wherein the emission layer comprises $In_u Ga_v Al_{1-u-v} N$ where $0 \le u \le 1$, $0 \le v \le 1$, and $u+v \le 1$,
the first contact layer comprises GaN, and
the composition gradient layer is provided between the emission layer and a first cladding layer and comprises $In_u Ga_v Al_{1-u-v} N$ where $0 \le u \le 1$, $0 \le v \le 1$, and $u+v \le 1$, and
a composition ratio of the group III of the composition gradient layer approaches a composition ratio of the group III of the first cladding layer as the composition gradient layer approaches the first cladding layer.

13. The semiconductor light-emitting device according to claim 4,
wherein the emission layer comprises at least one of $In_z(Ga_{1-w}Al_w)_{1-z}P$ where $0 \le z \le 1$ and $0 \le w \le 1$, $Al_q Ga_{1-q} As$ where $0 \le q \le 0.45$, and $In_g Ga_{1-g} As_h P_{1-h}$ where $0 \le g \le 1$ and $0 \le h \le 1$,
the first contact layer comprises GaP,
the composition gradient layer is provided between a cladding layer and the first contact layer and comprises $In_x(Ga_{1-y}Al_y)_{1-x}P$ where $0<x \le 1$ and $0<y \le 1$, and
x and y approach zero as the composition gradient layer approaches the first contact layer.

14. The semiconductor light-emitting device according to claim 4, wherein the first contact layer has a thickness which is equal to or greater than 0.02 μm and equal to or less than 1 μm.

15. The semiconductor light-emitting device according to claim 4, wherein the composition gradient layer has a thickness which is equal to or greater than 0.01 μm and equal to or less than 0.1 μm.

16. The semiconductor light-emitting device according to claim 4,
wherein the transparent conductive film has a thickness of 100 to 300 nm,
the first contact layer has a thickness which is equal to or greater than 0.02 μm and equal to or less than 1 μm, and
the composition gradient layer has a thickness which is equal to or greater than 0.01 μm and equal to or less than 0.1 μm.

17. The semiconductor light-emitting device according to claim 4,
wherein the transparent conductive film includes at least one of tin-doped indium oxide, tin oxide, and zinc oxide, and
the reflective metal layer includes at least one of Ag, an Ag alloy, and Au.

18. The semiconductor light-emitting device according to claim 4, wherein the barrier metal layer includes at least one of Ti, Pt, and Ni, and the bonding metal layer includes at least one of AuIn and Au.

19. The semiconductor light-emitting device according to claim 5,
wherein the emission layer comprises $In_u Ga_v Al_{1-u-v} N$ where $0 \le u \le 1$, $0 \le v \le 1$, and $u+v \le 1$,
the first contact layer comprises GaN, and
the composition gradient layer is provided between the emission layer and a first cladding layer and comprises $In_u Ga_v Al_{1-u-v} N$ where $0 \le u \le 1$, $0 \le v \le 1$, and $u+v \le 1$, and
a composition ratio of the group III of the composition gradient layer approaches a composition ratio of the group III of the first cladding layer as the composition gradient layer approaches the first cladding layer.

20. The semiconductor light-emitting device according to claim 5,
wherein the emission layer comprises at least one of $In_z(Ga_{1-w}Al_w)_{1-z}P$ where $0 \le z \le 1$ and $0 \le w \le 1$, $Al_q Ga_{1-q} As$ where $0 \le q \le 0.45$, and $In_g Ga_{1-g} As_h P_{1-h}$ where $0 \le g \le 1$ and $0 \le h \le 1$,
the first contact layer comprises GaP,
the composition gradient layer is provided between a cladding layer and the first contact layer and comprises $In_x(Ga_{1-y}Al_y)_{1-x}P$ where $0<x \le 1$ and $0<y \le 1$, and
x and y approach zero as the composition gradient layer approaches the first contact layer.

* * * * *